(12) United States Patent
Numagi et al.

(10) Patent No.: US 10,716,211 B2
(45) Date of Patent: Jul. 14, 2020

(54) PRINTED CIRCUIT BOARD, PRINTED WIRING BOARD, ELECTRONIC DEVICE, AND CAMERA

(71) Applicant: CANON KABUSHIKI KAISHA, Tokyo (JP)

(72) Inventors: Takashi Numagi, Hachioji (JP); Shoji Matsumoto, Fujisawa (JP); Hiroyuki Yamaguchi, Yokohama (JP); Youhei Tazawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1 day.

(21) Appl. No.: 16/264,401

(22) Filed: Jan. 31, 2019

(65) Prior Publication Data

US 2019/0246498 A1 Aug. 8, 2019

(30) Foreign Application Priority Data

Feb. 8, 2018 (JP) .................................. 2018-021418
Jan. 11, 2019 (JP) .................................. 2019-003833

(51) Int. Cl.
*H05K 1/11* (2006.01)
*H05K 1/18* (2006.01)
*H04N 5/225* (2006.01)
*H04N 5/232* (2006.01)

(52) U.S. Cl.
CPC .......... *H05K 1/115* (2013.01); *H04N 5/2253* (2013.01); *H05K 1/111* (2013.01); *H05K 1/181* (2013.01); *H04N 5/23206* (2013.01); *H05K 2201/09227* (2013.01); *H05K 2201/09263* (2013.01); *H05K 2201/10159* (2013.01)

(58) Field of Classification Search
CPC ... H05K 1/00; H05K 1/02; H05K 1/11; H05K 1/111; H05K 1/14; H05K 1/141–144; H05K 1/181–188
USPC ................. 361/764, 782, 784, 792–795, 803
See application file for complete search history.

(56) References Cited

U.S. PATENT DOCUMENTS

| | | | |
|---|---|---|---|
| 5,101,252 | A | 3/1992 | Matsumoto |
| 7,355,864 | B2 | 4/2008 | Matsumoto |
| 7,545,652 | B2 | 6/2009 | Yamaguchi |
| 7,564,695 | B2 | 7/2009 | Matsumoto |
| 7,577,004 | B2 | 8/2009 | Matsumoto |
| 7,595,546 | B2 | 9/2009 | Matsumoto |

(Continued)

FOREIGN PATENT DOCUMENTS

JP      2008-171950      7/2008

*Primary Examiner* — Tuan T Dinh
(74) *Attorney, Agent, or Firm* — Venable LLP

(57) ABSTRACT

A printed wiring board includes a plurality of first wirings and a plurality of second wirings. The plurality of first wirings each include a first via conductor disposed outside a first region, a second region, and a third region in a plan view, and a first conductor pattern extending from the first via conductor to the first region. The plurality of second wirings each include a second via conductor disposed outside the first region, the second region, and the third region, and a second conductor pattern extending from the second via conductor to the first region. A fourth region overlaps with a fifth region in the plan view, the fourth region being a region in which a plurality of first conductor patterns are disposed, the fifth region being a region in which a plurality of second conductor patterns are disposed.

12 Claims, 18 Drawing Sheets

(56) References Cited

U.S. PATENT DOCUMENTS

| | | |
|---|---|---|
| 7,728,444 B2 | 6/2010 | Hayashi |
| 7,916,497 B2 | 3/2011 | Yamaguchi |
| 8,428,155 B2 | 4/2013 | Matsumoto |
| 9,192,044 B2 | 11/2015 | Hayashi |
| 9,538,634 B2 | 1/2017 | Yamaguchi |
| 9,907,155 B2 | 2/2018 | Numagi |
| 2002/0116368 A1 | 8/2002 | Matsumoto |
| 2008/0025007 A1* | 1/2008 | Ao .................. H05K 1/115 |
| | | 361/760 |
| 2012/0262885 A1* | 10/2012 | Ikeda ............... H05K 1/0243 |
| | | 361/748 |
| 2018/0168039 A1 | 6/2018 | Numagi |

\* cited by examiner

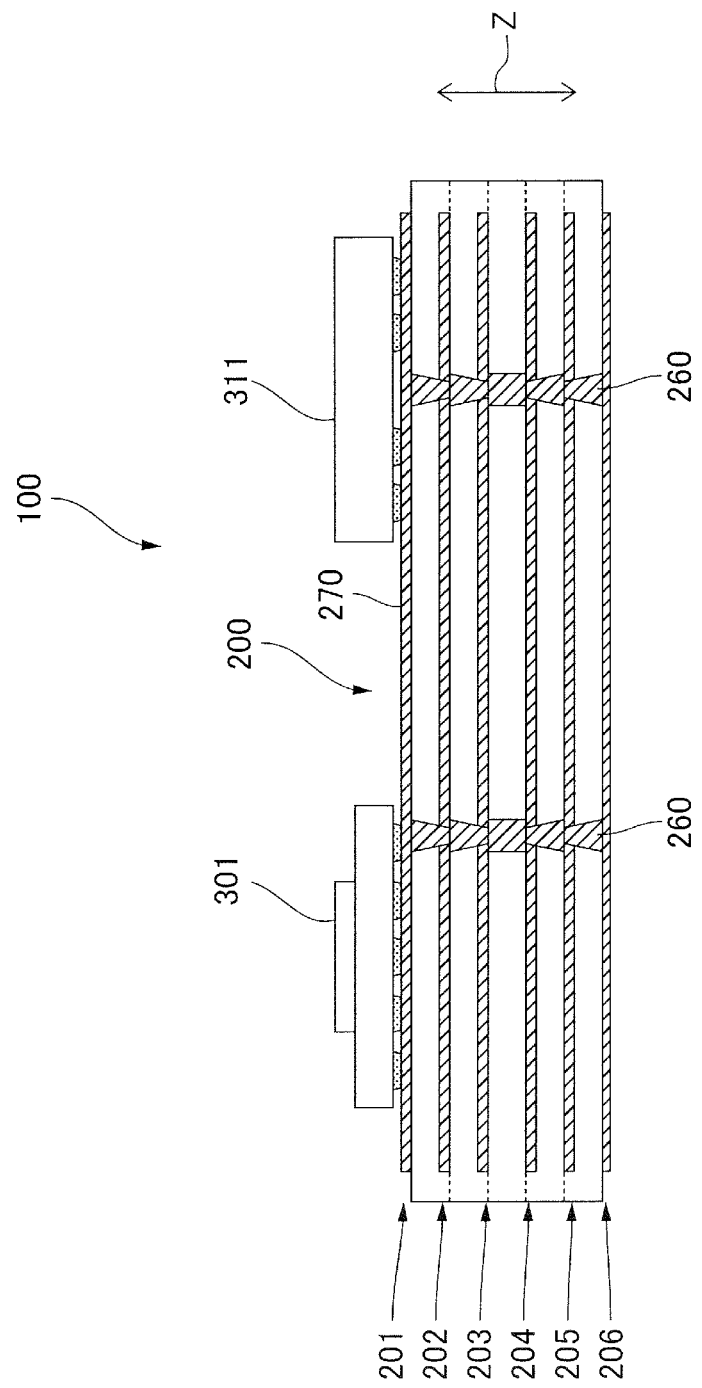

PRINTED CIRCUIT BOARD, PRINTED WIRING BOARD, ELECTRONIC DEVICE, AND CAMERA

BACKGROUND OF THE INVENTION

Field of the Invention

The present invention relates to a technique of a printed wiring board provided with an element including a plurality of receiving terminals and an element including a plurality of transmission terminals.

Description of the Related Art

A memory system serving as an example of a printed circuit board includes a memory controller serving as an example of an element including a plurality of transmission terminals, a memory device serving as an example of an element including a plurality of receiving terminals, and a printed wiring board on which these are mounted.

The transmission terminals of the memory controller and the receiving terminals of the memory device are electrically interconnected through bus lines on the printed wiring board. The memory controller controls the memory device by transmitting an address signal and a command signal to the memory device through the bus wirings.

In addition, the memory controller and the memory device each include a data terminal to communicate a data signal, and the data terminal of the memory controller and the data terminal of the memory device are electrically interconnected through a data signal wiring of the printed wiring board.

A highly functional electronic device needs to process a large amount of data. An electronic device disclosed in Japanese Patent Laid-Open No. 2008-171950 includes two memory devices, and thus is capable of processing a large amount of data. The two memory devices disclosed in Japanese Patent Laid-Open No. 2008-171950 are electrically connected to a memory controller through bus wirings constituted by T-branching wirings.

However, in a conventional printed wiring board, a plurality of wirings constituting the bus wirings each have the same configuration, the plurality of wirings are arranged in the width direction, and therefore the printed wiring board is large in size. Therefore, a printed circuit board is large in size, and an electronic device incorporating the printed circuit board is also large.

SUMMARY OF THE INVENTION

According to a first aspect of the present invention, a printed circuit board includes a printed wiring board, a first element, a second element, and a third element. The printed wiring board includes a first layer and a second layer disposed with an interval therebetween. The first element includes a plurality of first transmission terminals and a plurality of second transmission terminals and provided on the printed wiring board. The second element includes a plurality of first receiving terminals and a plurality of second receiving terminals and provided on the printed wiring board. The third element includes a plurality of third receiving terminals and a plurality of fourth receiving terminals and provided on the printed wiring board. The printed wiring board includes a plurality of first wirings configured to electrically connect the plurality of first transmission terminals to the plurality of first receiving terminals and to the plurality of third receiving terminals, and a plurality of second wirings configured to electrically connect the plurality of second transmission terminals to the plurality of second receiving terminals and to the plurality of fourth receiving terminals. The plurality of first wirings each include a first via conductor disposed to bridge the first layer and the second layer and disposed outside a first region in which the first element is positioned, a second region in which the second element is positioned, and a third region in which the third element is positioned in a plan view from a direction perpendicular to a main surface of the printed wiring board, and a first conductor pattern disposed on the first layer and extending from the first via conductor to the first region in the plan view. The plurality of second wirings each include a second via conductor disposed to bridge the first layer and the second layer and disposed outside the first region, the second region, and the third region in the plan view, and a second conductor pattern disposed on the second layer and extending from the second via conductor to the first region in the plan view. A fourth region is disposed so as to overlap with a fifth region in the plan view, the fourth region being a region in which a plurality of first conductor patterns each of which is the first conductor pattern are disposed, the fifth region being a region in which a plurality of second conductor patterns each of which is the second conductor pattern are disposed.

According to a second aspect of the present invention, a printed wiring board on which a first region in which a first element including a plurality of first transmission terminals and a plurality of second transmission terminals is to be disposed, a second region in which a second element including a plurality of first receiving terminals and a plurality of second receiving terminals is to be disposed, and a third region in which a third element including a plurality of third receiving terminals and a plurality of fourth receiving terminals is to be disposed are present in a plan view from a direction perpendicular to a main surface. The printed wiring board includes a first layer and a second layer disposed with an interval therebetween. The printed wiring board includes a plurality of first wirings configured to electrically connect the plurality of first transmission terminals to the plurality of first receiving terminals and to the plurality of third receiving terminals, and a plurality of second wirings configured to electrically connect the plurality of second transmission terminals to the plurality of second receiving terminals and to the plurality of fourth receiving terminals. The plurality of first wirings each include a first via conductor disposed to bridge the first layer and the second layer and disposed outside the first region, the second region, and the third region in the plan view, and a first conductor pattern disposed on the first layer and extending from the first via conductor to the first region in the plan view. The plurality of second wirings each include a second via conductor disposed to bridge the first layer and the second layer and disposed outside the first region, the second region, and the third region in the plan view, and a second conductor pattern disposed on the second layer and extending from the second via conductor to the first region in the plan view. A fourth region is disposed so as to overlap with a fifth region in the plan view, the fourth region being a region in which a plurality of first conductor patterns each of which is the first conductor pattern are disposed, the fifth region being a region in which a plurality of second conductor patterns each of which is the second conductor pattern are disposed.

Further features of the present invention will become apparent from the following description of exemplary embodiments with reference to the attached drawings.

BRIEF DESCRIPTION OF THE DRAWINGS

FIG. 3 is a section view of a printed circuit board according to the first exemplary embodiment.

DESCRIPTION OF THE EMBODIMENTS

Exemplary embodiments of the present invention will be described in detail below with reference to drawings.

First Exemplary Embodiment

Figure 1A:
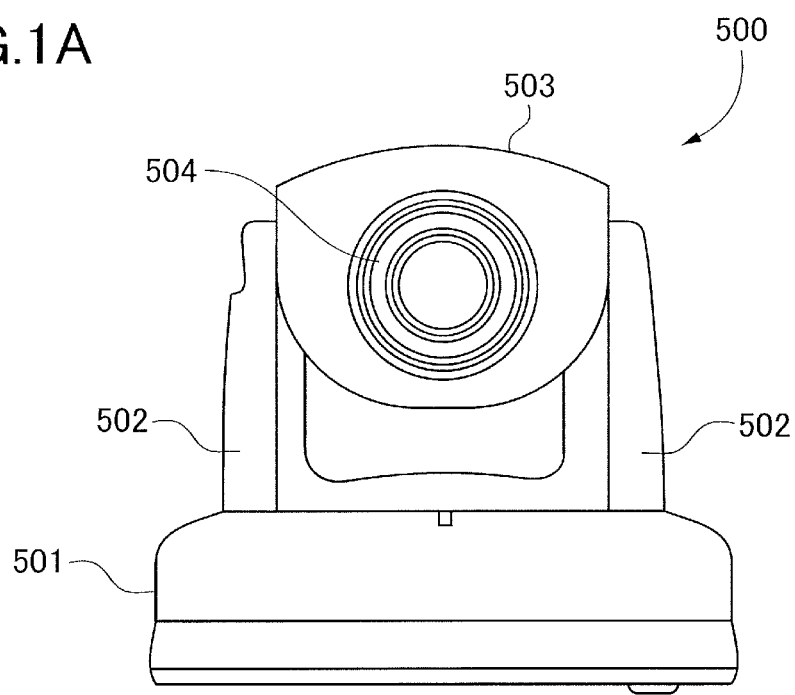
FIG. 1A is a front view of a network camera serving as an example of an electronic device according to a first exemplary embodiment.
Figure 1B:
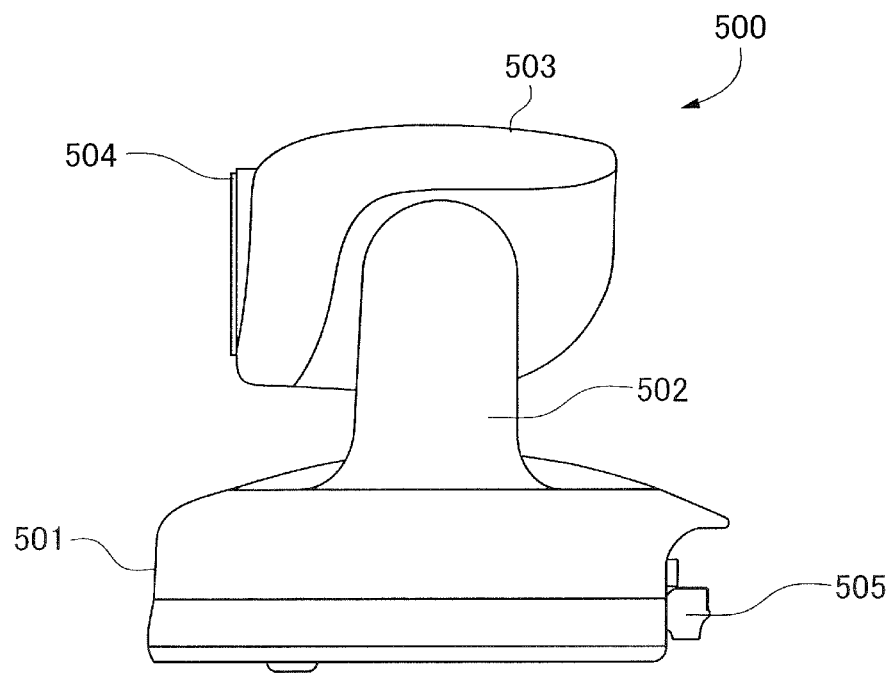
FIG. 1B is a side view of the network camera according to the first exemplary embodiment.

FIG. 1A is a front view of a network camera 500 serving as an example of an electronic device according to a first exemplary embodiment, and FIG. 1B is a side view of the network camera 500 according to the first exemplary embodiment. The network camera 500 includes a rotary base 501, a pair of support bases 502 provided on the rotary base 501, a lens frame 503 that is a casing supported by the pair of support bases 502, and a lens unit 504 that is a lens barrel provided in a front portion of the lens frame 503. A power terminal 505 is disposed in a rear portion of the rotary base 501. The orientation of the lens unit 504 is variable with respect to the rotary base 501. The network camera 500 is remotely operated by an unillustrated remote controller directly or through a network, and thus is capable of changing the orientation, zooming, focusing, and the like of the lens unit 504.

Figure 2:
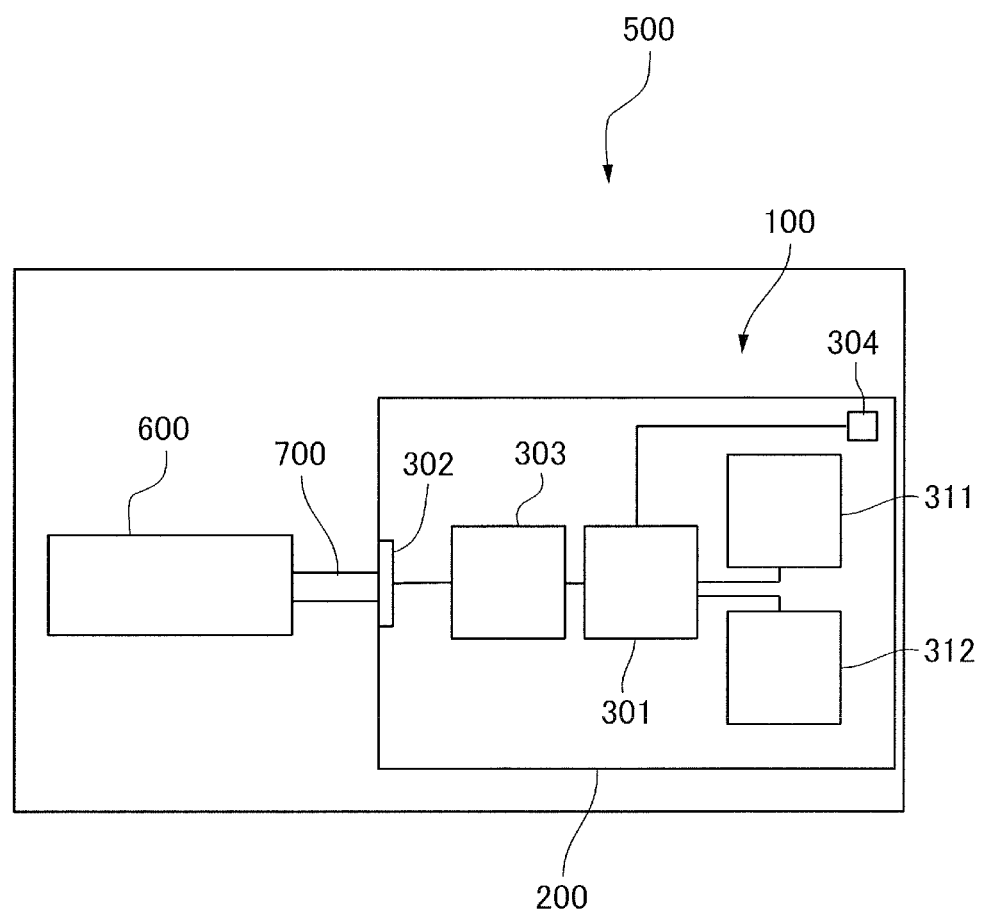
FIG. 2 is a block diagram of the network camera according to the first exemplary embodiment.

FIG. 2 is a block diagram of the network camera 500 according to the first exemplary embodiment. The network camera 500 is a digital camera, and includes an image pickup element 600 and a printed circuit board 100 electrically connected to the image pickup element 600 through a cable 700. The printed circuit board 100 includes a printed wiring board 200. The printed circuit board 100 includes a memory controller 301 serving as an example of a first element, a memory device 311 serving as an example of a second element, and a memory device 312 serving as an example of a third element. The memory device 311 and the memory device 312 are memory devices configured in the same manner. The memory devices 311 and 312 are for example, memories of double data rate 4: DDR4. The printed circuit board 100 includes a connector 302, a bridge chip 303, and a local area network chip: LAN chip 304. The memory controller 301, the memory devices 311 and 312, the connector 302, the bridge chip 303, and the LAN chip 304 are mounted on the printed wiring board 200.

The image pickup element 600 and the connector 302 are electrically interconnected through the cable 700 that is, for example, a flexible flat cable. The connector 302 and the bridge chip 303 are electrically interconnected through the wiring of the printed wiring board 200. The bridge chip 303 and the memory controller 301 are electrically interconnected through the wiring of the printed wiring board 200. The memory controller 301 and the LAN chip 304 are electrically interconnected through the wiring of the printed wiring board 200. The memory controller 301 is electrically connected to the two memory devices 311 and 312 through the wiring of the printed wiring board 200.

The image pickup element 600 is disposed in the vicinity of the lens unit 504 illustrated in FIGS. 1A and 1B in the lens frame 503. The image pickup element 600 is an image sensor, and outputs an image data signal indicating a captured image. The image pickup element 600 is, for example, a complementary metal oxide semiconductor: CMOS image sensor, or a charge coupled device: CCD image sensor.

The bridge chip 303 is a member that is provided in the case where a signal output from the image pickup element 600 needs to be converted into a signal that can be processed by the memory controller 301. In the case where the output signal of the image pickup element 600 can be processed by the memory controller 301 as it is, the bridge chip 303 can be omitted.

The memory controller 301 and the memory devices 311 and 312 are each constituted by one semiconductor package. The memory controller 301 and the memory device 311 are electrically interconnected through data signal wirings of the printed wiring board 200 such that communication of the image data signal can be performed. The memory controller 301 and the memory device 312 are electrically interconnected through data signal wirings of the printed wiring board 200 such that communication of the image data signal can be performed.

Furthermore, the memory controller 301 is electrically connected to the memory devices 311 and 312 by address/command signal wirings serving as bus wirings constituted by a plurality of wirings of the printed wiring board 200. The memory controller 301 transmits address signals and command signals serving as examples of digital signals to the two memory devices 311 and 312 through the address/command signal wirings by a parallel transmission method. The address signals and command signals transmitted from the memory controller 301 are received by the two memory devices 311 and 312 through the address/command signal wirings. The memory devices 311 and 312 each perform processing such as storing and deleting data in accordance with the address signals and command signals.

The memory controller 301 transmits an image data signal obtained from the memory device 311 or 312 or the bridge chip 303 to the LAN chip 304. The LAN chip 304 is capable of transmitting the image data signal to the outside of the network camera 500 through an unillustrated LAN cable of the like.

FIG. 3 is a section view of the printed circuit board 100 according to the first exemplary embodiment. FIG. 3 only illustrates the memory device 311 among the memory devices 311 and 312 illustrated in FIG. 2. The printed wiring board 200 includes an insulating substrate that is formed from, for example, epoxy resin, and a conductor constituting the wiring which is, for example, copper. The wiring is provided on the substrate.

The printed wiring board 200 is a laminated substrate including six wiring layers 201, 202, 203, 204, 205, and 206. The six wiring layers 201 to 206 are arranged in a Z direction, which is a lamination direction perpendicular to the main surface of the printed wiring board 200, with intervals therebetween. The wiring layers 201 to 206 are arranged from one side toward the other side in the Z direction in the order of the wiring layer 201, the wiring layer 202, the wiring layer 203, the wiring layer 204, the wiring layer 205, and the wiring layer 206. The wiring layers 201 and 206 are main surfaces, that is, surface layers serving as mounting surfaces, and the wiring layers 202 to 205 disposed between the wiring layers 201 and 206 are inner layers. To be noted, unillustrated solder resists may be disposed on the wiring layers 201 and 206.

The wiring layers 201 to 206 are each provided with a conductor pattern 270 of, for example, copper foil constituting the wiring, and via conductors 260 are disposed between the wiring layers 201 to 206. The via conductors 260 are conductors disposed in vias. In the present exemplary embodiment, the via conductors 260 are build-up vias. To be noted, FIG. 3 does not accurately illustrate the data signal wirings and address/command signal wirings, and schematically illustrates the section of the printed wiring board 200 to describe the wiring layers 201 to 206.

The memory controller 301, the memory device 311, and the memory device 312 illustrated in FIG. 2 are all mounted on the wiring layer 201 among the wiring layers 201 and 206 serving as a pair of surface layers. To be noted, although the two memory devices 311 and 312 are preferably both mounted on the wiring layer 201, one of the two may be mounted on the wiring layer 201 and the other of the two may be mounted on the wiring layer 206. In addition, although the memory controller 301 is preferably mounted on the same wiring layer 201 as the memory devices 311 and 312, the memory controller 301 may be mounted on the wiring layer 206.

Parts such as capacitors and resistors are mounted on the wiring layer 206. The wiring layers 202 and 205 are layers on which conductor patterns serving as grounds are mainly disposed. The wiring layer 203 serving as a first layer is a layer relatively closer to the wiring layer 201 than the wiring layer 204 serving as a second layer. The wiring layers 203 and 204 are layers on which conductor patterns serving as signal wirings such as the data signal wirings and the address/command signal wirings are mainly disposed.

The memory controller 301 and the memory devices 311 and 312 each include a plurality of signal terminals, a plurality of power terminals, and a plurality of ground terminals. Each terminal of the memory controller 301 and the memory devices 311 and 312 has a configuration of a ball grid array: BGA. The memory controller 301 and the memory devices 311 and 312 are bonded to the printed wiring board 200 by soldering.

Figure 4A:
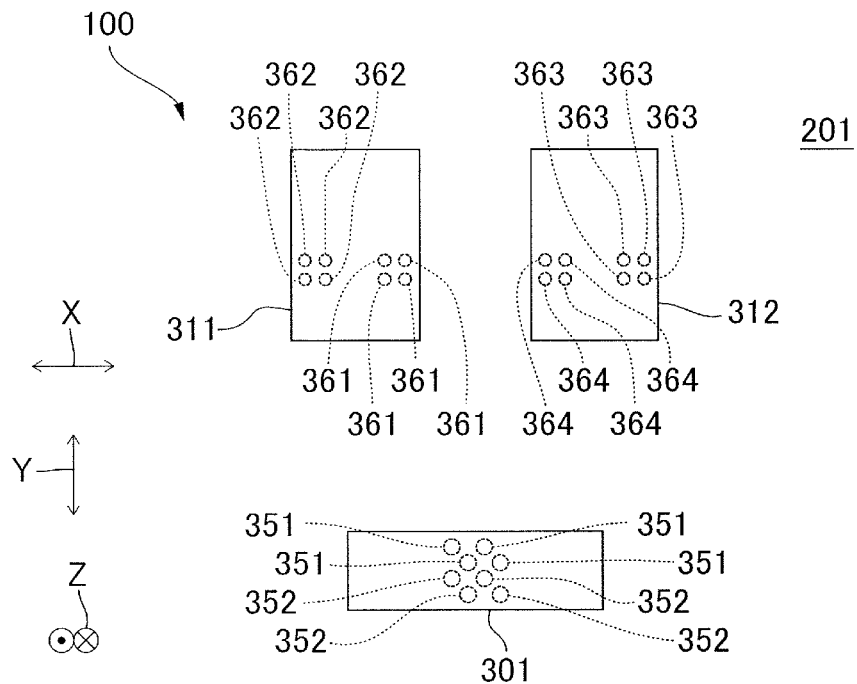
FIG. 4A is a schematic view of a memory controller and memory devices according to the first exemplary embodiment.
Figure 4B:
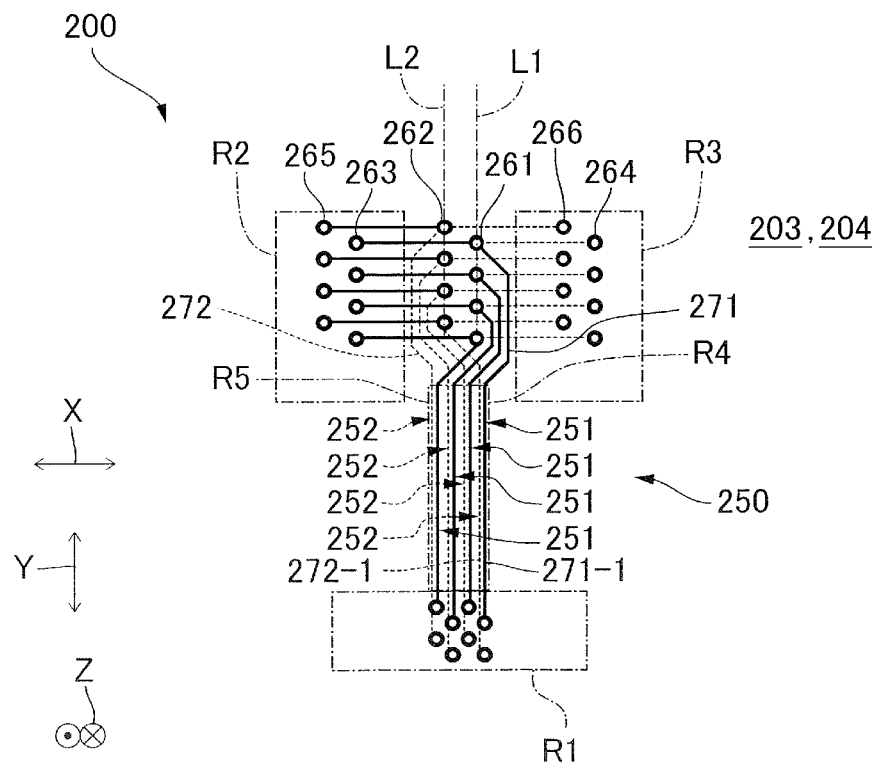
FIG. 4B is a schematic view of first wirings and second wirings according to the first exemplary embodiment.

FIG. 4A is a schematic view of the memory controller 301 and the memory devices 311 and 312 when the printed circuit board 100 according to the first exemplary embodiment is viewed in the Z direction. FIG. 4B is a schematic view of the wiring of the printed wiring board 200 when the printed circuit board 100 according to the first exemplary embodiment is viewed in the Z direction.

As illustrated in FIG. 4A, the memory device 311 and the memory device 312 are arranged in an X direction perpendicular to the Z direction with an interval therebetween. In addition, the memory controller 301 is disposed with an interval in a Y direction perpendicular to the X direction and the Z direction from the memory devices 311 and 312.

The memory controller 301 includes, as signal terminals, four transmission terminals 351 serving as a plurality of first transmission terminals, and four transmission terminals 352 serving as a plurality of second transmission terminals. The memory device 311 includes, as signal terminals, four receiving terminals 361 serving as a plurality of first receiving terminals and four receiving terminals 362 serving as a plurality of second receiving terminals. The memory device 312 includes, as signal terminals, four receiving terminals 363 serving as a plurality of third receiving terminals and four receiving terminals 364 serving as a plurality of fourth receiving terminals. That is, the memory controller 301 includes eight transmission terminals, and is thus capable of transmitting an 8-bit address signal and an 8-bit command signal. The memory devices 311 and 312 each include eight receiving terminals, and are each capable of receiving an 8-bit address signal and an 8-bit command signal. To be noted, in FIG. 4A, illustration of terminals of the memory controller 301 other than the transmission terminals 351 and 352 is omitted. In addition, illustration of terminals of the memory devices 311 and 312 other than the receiving terminals 361 to 364 is omitted. To be noted, the number of transmission terminals of the memory controller 301, the number of receiving terminals of the memory device 311, and the number of receiving terminals of the memory device 312 are not limited to 8.

FIG. 4B illustrates the wiring layers 203 and 204 of the printed wiring board 200. In FIG. 4B, conductor patterns disposed on the wiring layer 203 are indicated by solid wirings, and conductor patterns disposed on the wiring layer 204 are indicated by broken wirings. The printed wiring board 200 includes four wirings 251 serving as a plurality of first wirings electrically connecting the transmission terminals 351 illustrated in FIG. 4A to the receiving terminals 361 and 363. The printed wiring board 200 includes four wirings 252 serving as a plurality of second wirings electrically connecting the transmission terminals 352 illustrated in FIG. 4A to the receiving terminals 362 and 364. These eight wirings 251 and 252 constitute transmission paths for address signals and command signals, that is, the address/command signal wirings 250 serving as bus wirings. To be noted, the number of wirings constituting the address/command signal wirings 250 is not limited to 8. The number of wirings constituting the address/command signal wirings 250 may be set to correspond to the number of transmission terminals of the memory controller 301, the number of receiving terminals of the memory device 311, and the number of receiving terminals of the memory device 312.

In the printed wiring board 200, a first region in which the memory controller 301 illustrated in FIG. 4A is projected in the Z direction is set as a region R1. The memory controller 301 is disposed in the position of the region R1 on the printed wiring board 200 in a plan view, that is, as viewed in the Z direction. In the printed wiring board 200, a second region in which the memory device 311 illustrated in FIG. 4A is projected in the Z direction is set as a region R2. The memory device 311 is disposed in the position of the region R2 on the printed wiring board 200 as viewed in the Z direction. In the printed wiring board 200, a third region in which the memory device 312 illustrated in FIG. 4A is projected in the Z direction is set as a region R3. The memory device 312 is disposed in the position of the region R3 on the printed wiring board 200 as viewed in the Z direction.

Figure 5A:
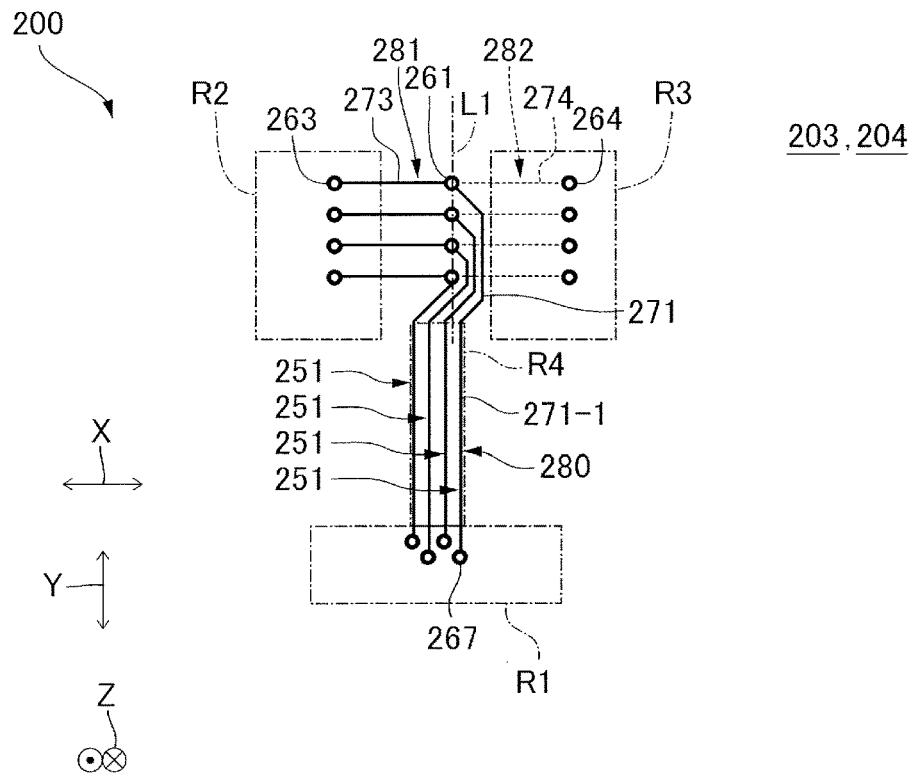
FIG. 5A is a schematic view of the first wirings according to the first exemplary embodiment.
Figure 5B:
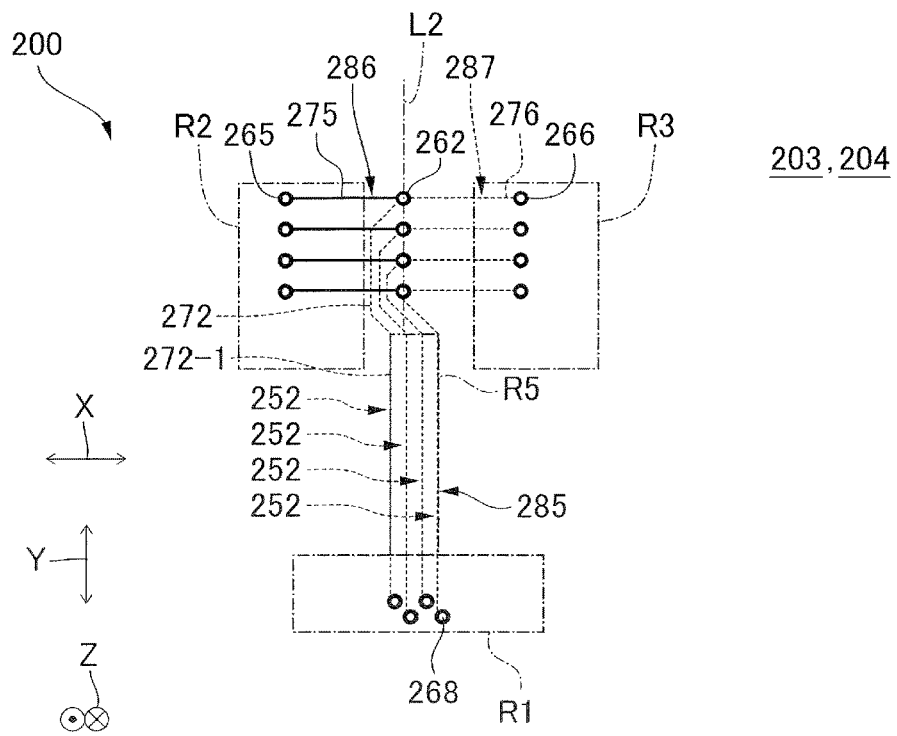
FIG. 5B is a schematic view of the second wirings according to the first exemplary embodiment.

FIG. 5A is a schematic view of the wirings 251 of the printed wiring board 200 when the printed circuit board 100 according to the first exemplary embodiment is viewed in the Z direction. FIG. 5B is a schematic view of the wirings 252 of the printed wiring board 200 when the printed circuit board 100 according to the first exemplary embodiment is viewed in the Z direction. Similarly to FIG. 4B, FIGS. 5A and 5B respectively illustrate the wiring layers 203 and 204 of the printed wiring board 200. Similarly to FIG. 4B, in FIGS. 5A and 5B, the conductor patterns disposed on the wiring layer 203 are indicated by solid wirings, and the conductor patterns disposed on the wiring layer 204 are indicated by broken wirings.

As illustrated in FIG. 5A, the wirings 251 each include a main wiring 280 extending from the memory controller 301 illustrated in FIG. 4A and two branching wirings 281 and 282 branching from the main wiring 280 and respectively extending to the memory devices 311 and 312 illustrated in FIG. 4A. One ends of the main wirings 280 are connected to the transmission terminals 351 of the memory controller 301 illustrated in FIG. 4A. The other ends of the main wirings 280 are connected to one ends of the branching wirings 281 and one ends of the branching wirings 282. The other ends of the branching wirings 281 are connected to the receiving terminals 361 of the memory device 311 illustrated in FIG. 4A. The other ends of the branching wirings 282 are connected to the receiving terminals 363 of the memory device 312 illustrated in FIG. 4A. As described above, the wirings 251 each have a T-branching structure.

As illustrated in FIG. 5B, the wirings 252 each include a main wiring 285 extending from the memory controller 301 illustrated in FIG. 4A and two branching wirings 286 and 287 branching from the main wiring 285 and respectively extending to the memory devices 311 and 312 illustrated in FIG. 4A. One ends of the main wirings 285 are connected to the transmission terminals 352 of the memory controller 301 illustrated in FIG. 4A. The other ends of the main wirings 285 are connected to one ends of the branching wirings 286 and one ends of the branching wirings 287. The other ends of the branching wirings 286 are connected to the receiving terminals 362 of the memory device 311 illustrated in FIG. 4A. The other ends of the branching wirings 287 are connected to the receiving terminals 364 of the memory device 312 illustrated in FIG. 4A. As described above, the wirings 252 each have a T-branching structure.

The wirings 251 and the wirings 252 will be described below in detail. As illustrated in FIG. 5A, the wirings 251 each include a via conductor 261 serving as a first via conductor disposed outside the regions R1 to R3 as viewed in the Z direction. The via conductors 261 are disposed so as to bridge the wiring layer 203 and the wiring layer 204 illustrated in FIG. 3. As illustrated in FIG. 5B, the wirings 252 each include a via conductor 262 serving as a second via conductor disposed outside the regions R1 to R3 as viewed in the Z direction. The via conductors 262 are disposed so as to bridge the wiring layer 203 and the wiring layer 204 illustrated in FIG. 3. In the present exemplary embodiment, the via conductors 261 are included in the branching wirings 282, and the via conductors 262 are included in the branching wirings 286.

The main wirings 280 of the wirings 251 illustrated in FIG. 5A each include a conductor pattern 271 serving as a first conductor pattern extending from the via conductor 261 to the region R1 as viewed in the Z direction. In the present exemplary embodiment, the conductor patterns 271 extend from the via conductors 261 to the inside of the region R1 as viewed in the Z direction. The main wirings 285 of the wirings 252 illustrated in FIG. 5B each include a conductor pattern 272 serving as a second conductor pattern extending from the via conductor 262 to the region R1 as viewed in the Z direction. In the present exemplary embodiment, the conductor patterns 272 extend from the via conductors 262 to the inside of the region R1 as viewed in the Z direction. The conductor patterns 271 illustrated in FIG. 5A are disposed on the wiring layer 203, and the conductor patterns 272 illustrated in FIG. 5B are disposed on the wiring layer 204 different from the wiring layer 203. Since the conductor patterns 271 and the conductor patterns 272 are disposed on different layers, the conductor patterns 271 and the conductor patterns 272 being arranged in a wide area in the width direction of the main wirings 280 and 285, that is, the X direction illustrated in FIG. 4B can be suppressed. As a result of this, the size of the printed wiring board 200 can be reduced. Therefore, the size of the printed circuit board 100 can be reduced, and thus the size of the network camera 500 illustrated in FIGS. 1A and 1B can be reduced.

Since the wirings 251 each include the conductor pattern 271 and the wirings 252 each include the conductor pattern 272, the plurality of conductor patterns 271 illustrated in FIG. 5A and the plurality of conductor patterns 272 illustrated in FIG. 5B are present in the present exemplary embodiment. In the present exemplary embodiment, four conductor patterns 271 and four conductor patterns 272 are present. The conductor patterns 271 illustrated in FIG. 5A each include a part 271-1 that is a part thereof extending linearly in the Y direction. The conductor patterns 272 illustrated in FIG. 5B each include a part 272-1 that is a part thereof extending linearly in the Y direction. It is noted, although the part 271-1 and the part 272-1 extends linearly in FIG. 5A and FIG. 5B, the part 271-1 and the part 272-1 do not necessary extend linearly.

The plurality of parts 271-1 extending in the Y direction illustrated in FIG. 5A are arranged with intervals therebetween in the X direction. The plurality of parts 272-1 extending in the Y direction illustrated in FIG. 5B are arranged with intervals therebetween in the X direction. As viewed in the Z direction, a fourth region in which the plurality of parts 271-1 are disposed is set as a region R4. The region R4 is a region between two whose distance between each other in the X direction is longest among the plurality of parts 271-1. As viewed in the Z direction, a fifth region in which the plurality of parts 272-1 are disposed is set as a region R5. The region R5 is a region between two whose distance between each other in the X direction is longest among the plurality of parts 272-1. It is noted, in FIG. 4B, the region R4 and R5 are illustrated as being slightly displaced in the X direction for the sake of convenience of description.

As illustrated in FIG. 4B, the region R4 and the region R5 partially or entirely overlap with each other as viewed in the Z direction. In the present exemplary embodiment, the region R4 and the region R5 entirely overlap with each other. In the case where the region R4 and the region R5 partially overlap with each other, it is preferable that equal to or more than a half of one of the regions R4 and R5 overlaps the other. Since the conductor patterns 271 are disposed on the wiring layer 203 and the conductor patterns 272 are disposed on the wiring layer 204, the region R4 and the region R5 can overlap with each other as viewed in the Z direction. Thus, the size of the printed wiring board 200 can be reduced.

To be noted, focusing on one of the plurality of wirings 251 and one of the plurality of wirings 252, it suffices as long as the part 271-1 and the part 272-1 partially or entirely overlap with each other as viewed in the Z direction. In the case where the part 271-1 and the part 272-1 partially overlap with each other, it is preferable that equal to or more than a half of one of the parts 271-1 and 272-1 overlaps the other. To be noted, in FIG. 4B, the parts 272-1 of the conductor patterns 272 are illustrated as being slightly displaced in the X direction with respect to the parts 271-1 of the conductor patterns 271 for the sake of convenience of description.

As illustrated in FIG. 5A, the branching wirings 281 of the wirings 251 each include a conductor pattern 273 serving as a third conductor pattern extending from the via conductor 261 to the region R2 as viewed in the Z direction. In the present exemplary embodiment, the conductor patterns 273 extend from the via conductors 261 to the inside of the region R2 as viewed in the Z direction. The branching wirings 282 of the wirings 251 each include a conductor pattern 274 serving as a fourth conductor pattern extending from the via conductor 261 to the region R3 as viewed in the Z direction. In the present exemplary embodiment, the conductor patterns 274 extend from the via conductors 261 to the inside of the region R4 as viewed in the Z direction. The conductor patterns 273 are disposed on the wiring layer 203, and the conductor patterns 274 are disposed on the wiring layer 204.

The branching wirings 281 of the wirings 251 each include a via conductor 263 serving as a third via conductor connected to the conductor pattern 273. The via conductors 263 are disposed inside the region R2 as viewed in the Z direction. The via conductors 263 are disposed so as to bridge the wiring layer 201 and the wiring layer 203 illustrated in FIG. 3. The branching wirings 282 of the wirings 251 each include a via conductor 264 serving as a fourth via conductor connected to the conductor pattern 274. The via conductors 264 are disposed inside the region R3 as viewed in the Z direction. The via conductors 264 are disposed so as to bridge the wiring layer 201 and the wiring layer 204 illustrated in FIG. 3.

As illustrated in FIG. 5B, the branching wirings 286 of the wirings 252 each include a conductor pattern 275 serving as a fifth conductor pattern extending from the via conductor 262 to the region R2 as viewed in the Z direction. In the present exemplary embodiment, the conductor patterns 275 extend from the via conductors 262 to the inside of the region R2 as viewed in the Z direction. The branching wirings 287 of the wirings 252 each include a conductor pattern 276 serving as a sixth conductor pattern extending from the via conductor 262 to the region R3 as viewed in the Z direction. In the present exemplary embodiment, the conductor patterns 276 extend from the via conductors 262 to the inside of the region R3 as viewed in the Z direction. The conductor patterns 275 are disposed on the wiring layer 203, and the conductor patterns 276 are disposed on the wiring layer 204.

The branching wirings 286 of the wirings 252 each include a via conductor 265 serving as a fifth via conductor connected to the conductor pattern 275. The via conductors 265 are disposed inside the region R2 as viewed in the Z direction. The via conductors 265 are disposed so as to bridge the wiring layer 201 and the wiring layer 203 illustrated in FIG. 3. The branching wirings 287 of the wirings 252 each include a via conductor 266 serving as a sixth via conductor connected to the conductor pattern 276. The via conductors 266 are disposed inside the region R3 as viewed in the Z direction. The via conductors 266 are disposed so as to bridge the wiring layer 201 and the wiring layer 204 illustrated in FIG. 3.

As illustrated in FIG. 5A, the main wirings 280 of the wirings 251 each include a via conductor 267 disposed inside the region R1 as viewed in the Z direction and connected to the conductor pattern 271. The via conductors 267 are disposed so as to bridge the wiring layer 201 and the wiring layer 203 illustrated in FIG. 3. As illustrated in FIG. 5B, the main wirings 285 of the wirings 252 each include a via conductor 268 disposed inside the region R1 as viewed in the Z direction and connected to the conductor pattern 272. The via conductors 268 are disposed so as to bridge the wiring layer 201 and the wiring layer 204 illustrated in FIG. 3. The via conductors 261 to 268 illustrated in FIGS. 5A and 5B are build-up vias.

As described above, the main wirings 280 illustrated in FIG. 5A include the via conductors 267 and the conductor patterns 271. The branching wirings 281 include the conductor patterns 273 and the via conductors 263. The branching wirings 282 include the via conductors 261, the conductor patterns 274 and the via conductors 264. To be noted, the via conductors 267 illustrated in FIG. 5A are electrically connected to the transmission terminals 351 of the memory controller 301 illustrated in FIG. 4A via unillustrated conductor patterns disposed on the wiring layer 201 illustrated in FIG. 3 and included in the main wirings 280. That is, the transmission terminals 351 of the memory controller 301 are bonded to the unillustrated conductor patterns disposed on the wiring layer 201 illustrated in FIG. 3 by soldering. The via conductors 263 and the receiving terminals 361 of the memory device 311 illustrated in FIG. 4A are electrically interconnected via unillustrated conductor patterns disposed on the wiring layer 201 illustrated in FIG. 3 and included in the branching wirings 281. That is, the receiving terminals 361 of the memory device 311 are bonded to the unillustrated conductor patterns disposed on the wiring layer 201 illustrated in FIG. 3 by soldering. The via conductors 264 and the receiving terminals 363 of the memory device 312 illustrated in FIG. 4A are electrically interconnected via unillustrated conductor patterns disposed on the wiring layer 201 illustrated in FIG. 3 and included in the branching wirings 282. That is, the receiving terminals 363 of the memory device 312 are bonded to the unillustrated conductor patterns disposed on the wiring layer 201 illustrated in FIG. 3 by soldering.

The main wirings 285 illustrated in FIG. 5B include the via conductors 268 and the conductor patterns 272. The branching wirings 286 include the via conductors 262, the conductor patterns 275, and the via conductors 265. The branching wirings 287 include the conductor patterns 276 and the via conductors 266. To be noted, the via conductors 268 illustrated in FIG. 5B are electrically connected to the transmission terminals 352 of the memory controller 301 illustrated in FIG. 4A via unillustrated conductor patterns disposed on the wiring layer 201 illustrated in FIG. 3 and included in the main wirings 285. That is, the transmission terminals 352 of the memory controller 301 are bonded to the unillustrated conductor patterns disposed on the wiring layer 201 illustrated in FIG. 3 by soldering. The via conductors 265 and the receiving terminals 362 of the memory device 311 illustrated in FIG. 4A are electrically interconnected via unillustrated conductor patterns disposed on the wiring layer 201 illustrated in FIG. 3 and included in the branching wirings 286. That is, the receiving terminals 362 of the memory device 311 are bonded to the unillustrated conductor patterns disposed on the wiring layer 201 illustrated in FIG. 3 by soldering. The via conductors 266 and the receiving terminals 364 of the memory device 312 illustrated in FIG. 4A are electrically interconnected via unillustrated conductor patterns disposed on the wiring layer 201 illustrated in FIG. 3 and included in the branching wirings 287. That is, the receiving terminals 364 of the memory device 312 are bonded to the unillustrated conductor patterns disposed on the wiring layer 201 illustrated in FIG. 3 by soldering.

As illustrated in FIG. 4A, the memory device 311 and the memory device 312 are arranged to oppose each other with an interval therebetween in the X direction as viewed in the Z direction. Therefore, as illustrated in FIG. 4B, the region R2 and the region R3 are arranged to oppose each other with an interval therebetween in the X direction. The plurality of via conductors 261 and the plurality of via conductors 262 are disposed between the regions R2 and R3 in the X direction.

The plurality of via conductors 261 are arranged on a straight line L1 serving as a virtual first straight line with intervals therebetween as viewed in the Z direction. The plurality of via conductors 262 are arranged on a straight line L2 different from the straight line L1 serving as a virtual second straight line with intervals therebetween as viewed in the Z direction. The straight line L1 and the straight line L2 are virtual straight lines extending in the Y direction parallel to each other with an interval therebetween in the X direction. That is, a via conductor group constituted by the plurality of via conductors 261 arranged in the Y direction and a via conductor group constituted by the plurality of via conductors 262 arranged in the Y direction are arranged with an interval therebetween in the X direction. The plurality of via conductors 261 and the plurality of via conductors 262 are arranged in a staggered manner so as to be displaced from each other in the Y direction. By arranging the via conductors 261 and 262 in this manner, the size of the printed wiring board 200 can be further reduced.

As viewed in the Z direction, the relative positions of the via conductors 262 with respect to the via conductors 261, the relative positions of the via conductors 265 with respect to the via conductors 263, and the relative positions of the via conductors 266 with respect to the via conductors 264 are all the same. That is, the arrangement of the via conductors 261 and 262, the arrangement of the via conductors 263 and 265, and the arrangement of the via conductors 264 and 266 are all the same. The positions of a via conductor group including the plurality of via conductors 261 and 262, the positions of a via conductor group including the plurality of via conductors 263 and 265, and the positions of a via conductor group including the plurality of via conductors 264 and 266 in the Y direction are the same. As a result of this, the wiring lengths of the conductor patterns 273 to 276 can be reduced, and thus the size of the printed wiring board 200 can be further reduced. In the present exemplary embodiment, as illustrated in FIG. 5A, the conductive patters 273 and 274 are formed to extend linearly in the X direction. As illustrated in FIG. 5B, the conductor patterns 275 and 276 are formed to extend linearly in the X direction. As a result of this, the size of the printed wiring board 200 can be further reduced.

As illustrated in FIG. 5A, in the conductor patterns 271, the via conductors 261 side of the parts 271-1 are formed in bent shapes to be connected to the via conductors 261. As illustrated in FIG. 5B, in the conductor patterns 272, the via conductors 262 side of the parts 272-1 are formed in bent shapes to be connected to the via conductors 262. The bent-shaped portions of the conductor patterns 271 and 272 on the via conductors 261 and 262 side are disposed outside the via conductor groups constituted by the plurality of via conductors 261 and the plurality of via conductors 262. Since the conductor patterns 271 and 272 are disposed outside the via conductor groups, the conductor patterns 273 to 276 drawn from the via conductor groups are arranged so as not to be short-circuited with the conductor patterns 271 and 272. That is, since the conductor patterns 271 are disposed on the wiring layer 203 and the conductor patterns 272 are disposed on the wiring layer 204, the conductor patterns 273 and 275 are disposed on the wiring layer 203, and the conductor patterns 274 and 276 are disposed on the wiring layer 204.

In addition, in the present exemplary embodiment, the conductor patterns 275 and the conductor patterns 276 are formed in the same wiring length. As a result of this, the electrical length of the branching wirings 286 is equal to the electrical length of the branching wirings 287, and thus generation of noise by multiple reflection of electric signals can be suppressed.

Figure 6A:
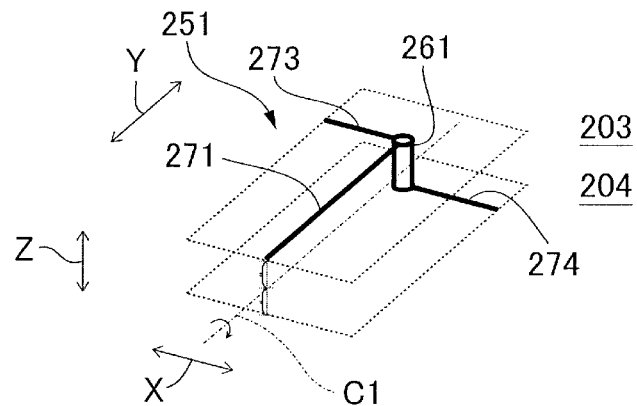
FIG. 6A is a schematic perspective view of a part of the first wiring according to the first exemplary embodiment.
Figure 6B:
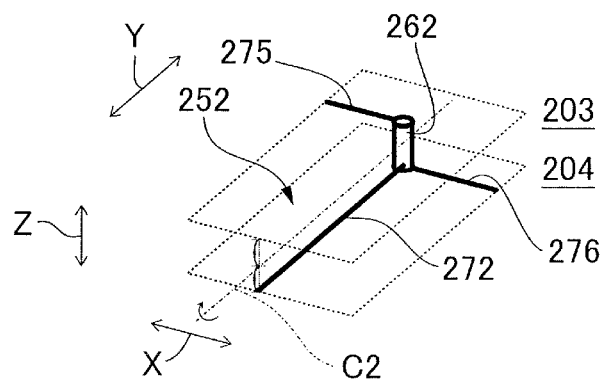
FIG. 6B is a schematic perspective view of a part of the second wiring according to the first exemplary embodiment.
Figure 6C:
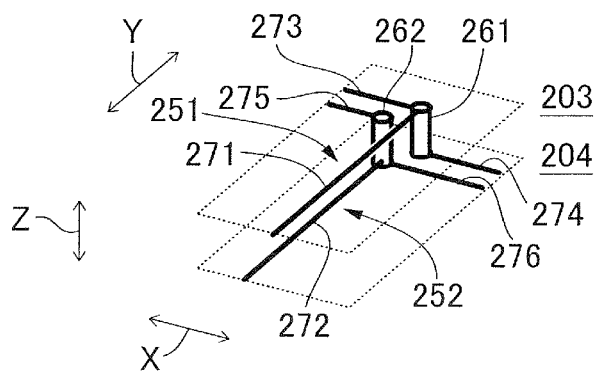
FIG. 6C is a schematic perspective view of parts of the first wiring and the second wiring according to the first exemplary embodiment.

FIG. 6A is a schematic perspective view of a part of the wiring 251 according to the first exemplary embodiment. FIG. 6B is a schematic perspective view of a part of the wiring 252 according to the first exemplary embodiment. FIG. 6C is a schematic perspective view of parts of the wirings 251 and 252 according to the first exemplary embodiment. As illustrated in FIG. 6A, the conductor patterns 271 of the wirings 251 are disposed on the wiring layer 203, the conductor patterns 273 of the wirings 251 are disposed on the wiring layer 203, and the conductor patterns 274 of the wirings 251 are disposed on the wiring layer 204. As illustrated in FIG. 6B, the conductor patterns 272 of the wirings 252 are disposed on the wiring layer 204, the conductor patterns 275 of the wirings 252 are disposed on the wiring layer 203, and the conductor patterns 276 of the wirings 252 are disposed on the wiring layer 204.

As illustrated in FIG. 6A, a virtual axis passing through centers of the via conductors 261 in the Z direction and extending in the Y direction is set as an axis C1. When the wirings 251 are rotated by 180° about the axis C1, the wirings 251 have almost the same arrangement as the wirings 252 illustrated in FIG. 6B. As illustrated in FIG. 6B, a virtual axis passing through centers of the via conductors 262 in the Z direction and extending in the Y direction is set as an axis C2. When the wirings 252 are rotated by 180° about the axis C2, the wirings 252 have almost the same arrangement as the wirings 251 illustrated in FIG. 6A.

By arranging the wirings 251 and 252 illustrated in FIGS. 6A and 6B so as to be displaced from each other in the X direction and the Y direction such that the via conductors 261 and 262 do not overlap with each other, short circuit of the wirings 251 and 252 can be suppressed. By arranging the plurality of wirings 251 and 252 of such configuration with intervals therebetween in the Y direction, the region R2 and the region R3 illustrated in FIG. 4B can be disposed close to each other. In this case, the conductor patterns 271 of the plurality of wirings 251 and the conductor patterns 272 of the wirings 252 may be formed in bent shapes such that the conductor patterns 271 of the plurality of wirings 251 and the conductor patterns 272 of the plurality of wirings 252 are not short-circuited with each other.

Comparative Example

Figure 15A:
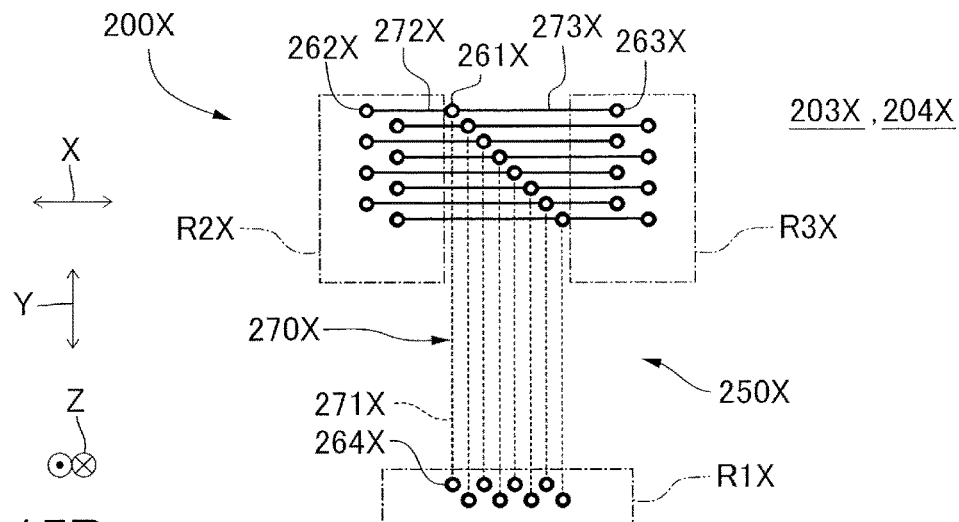
FIG. 15A is a schematic view of wiring of a comparative example.
Figure 15B:
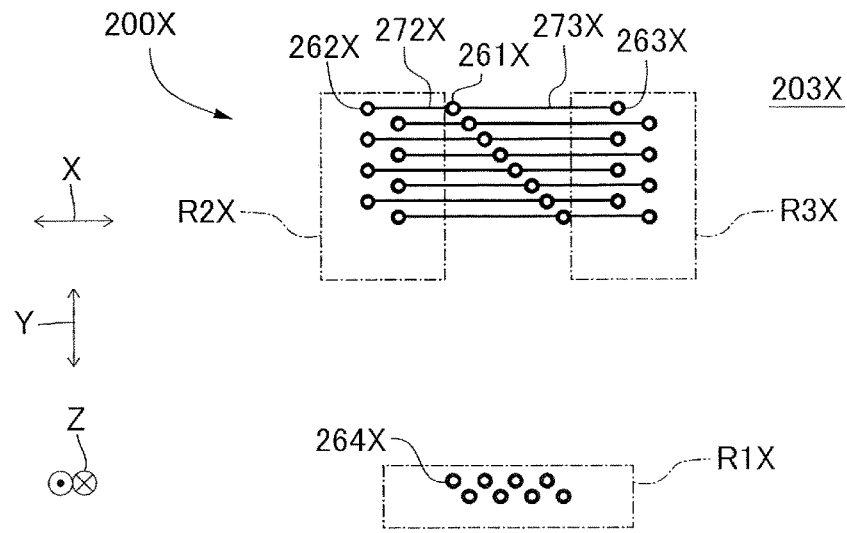
FIG. 15B is a schematic view of wiring of a comparative example.
Figure 15C:
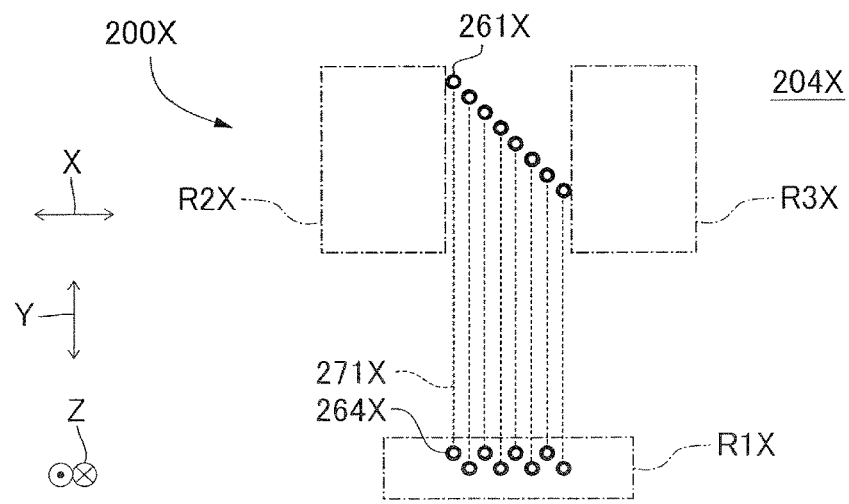
FIG. 15C is a schematic view of wiring of a comparative example.

FIG. 15A is a schematic view of wiring of a printed wiring board 200X when a printed circuit board of a comparative example is viewed in the Z direction. The printed wiring board 200X of the comparative example includes six wiring layers similarly to the printed wiring board 200 illustrated in FIG. 3. FIG. 15A illustrates a wiring layer 203X serving as a third layer and a wiring layer 204X serving as a fourth layer. In FIG. 15A, conductor patterns disposed on the wiring layer 203X are indicated by solid lines, and conductor patterns disposed on the wiring layer 204X are indicated by broken lines. FIG. 15B is a schematic view of wiring disposed on the wiring layer 203X of the printed wiring board 200X when the printed circuit board of the comparative example is viewed in the Z direction. FIG. 15C is a schematic view of wiring disposed on the wiring layer 204X of the printed wiring board 200X when the printed circuit board of the comparative example is viewed in the Z direction.

A plurality of wirings 270X constituting address/command signal wirings 250X of the comparative example are each a so-called T-branching wiring, and each have almost the same arrangement structure. Via conductors 264X are disposed in a region R1X corresponding to a memory controller, and via conductors 262X and 263X are respectively disposed in regions R2X and R3X corresponding to two memory devices. Via conductors 261X are disposed between the regions R2X and R3X. The via conductors 264X and the via conductors 261X are interconnected via conductor patterns 271X disposed on the wiring layer 204X. The via conductors 261X and the via conductors 262X are interconnected via conductor patterns 272X disposed on the wiring layer 203X. The via conductors 261X and the via conductors 263X are interconnected via conductor patterns 273X disposed on the wiring layers 203X.

The address/command signal wirings 250X of the comparative example are bus wirings in which a plurality of wirings 270X having the same T-branching wiring structure are disposed. Therefore, the address/command signal wirings 250X are disposed in a large bus wiring width in the X direction, and the area of the printed wiring board 200X as viewed in the Z direction increases. Therefore, the size of the printed wiring board 200X increases, and thus the size of the printed circuit board and the electronic device increases. Although the area of the printed wiring board 200X as viewed in the Z direction can be reduced by increasing the number of wiring layers, the production cost for the printed wiring board 200X increases in this case.

In the first exemplary embodiment, the area of the printed wiring board 200 as viewed in the Z direction can be reduced without increasing the number of wiring layers by arranging the conductor patterns 271 of the main wirings 280 and the conductor patterns 272 of the main wirings 285 in a staggered manner on the wiring layers 203 and 204. That is, since the size of the printed wiring board 200 can be reduced, the size of the printed circuit board 100 can be reduced, and thus the size of the network camera 500 can be reduced.

In addition, by processing the image data signal generated in the image pickup element 600 illustrated in FIG. 2 in the printed circuit board 100, a signal having excellent waveform quality can be generated, and thus image data of high image quality can be provided to a user.

An area occupied by address/command signal wirings will be described below with examples of numerical values.

Example 1

Figure 7:
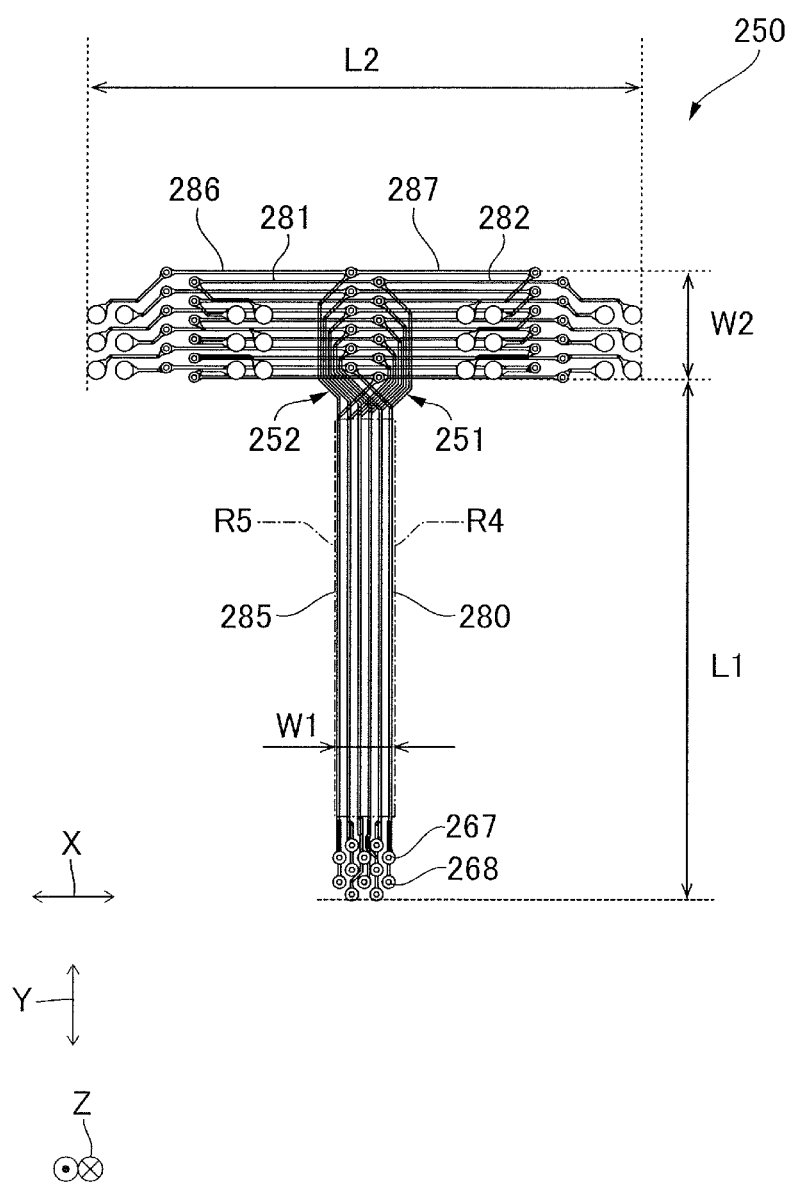
FIG. 7 is a plan view of address/command signal wirings of Example 1.
Figure 8:
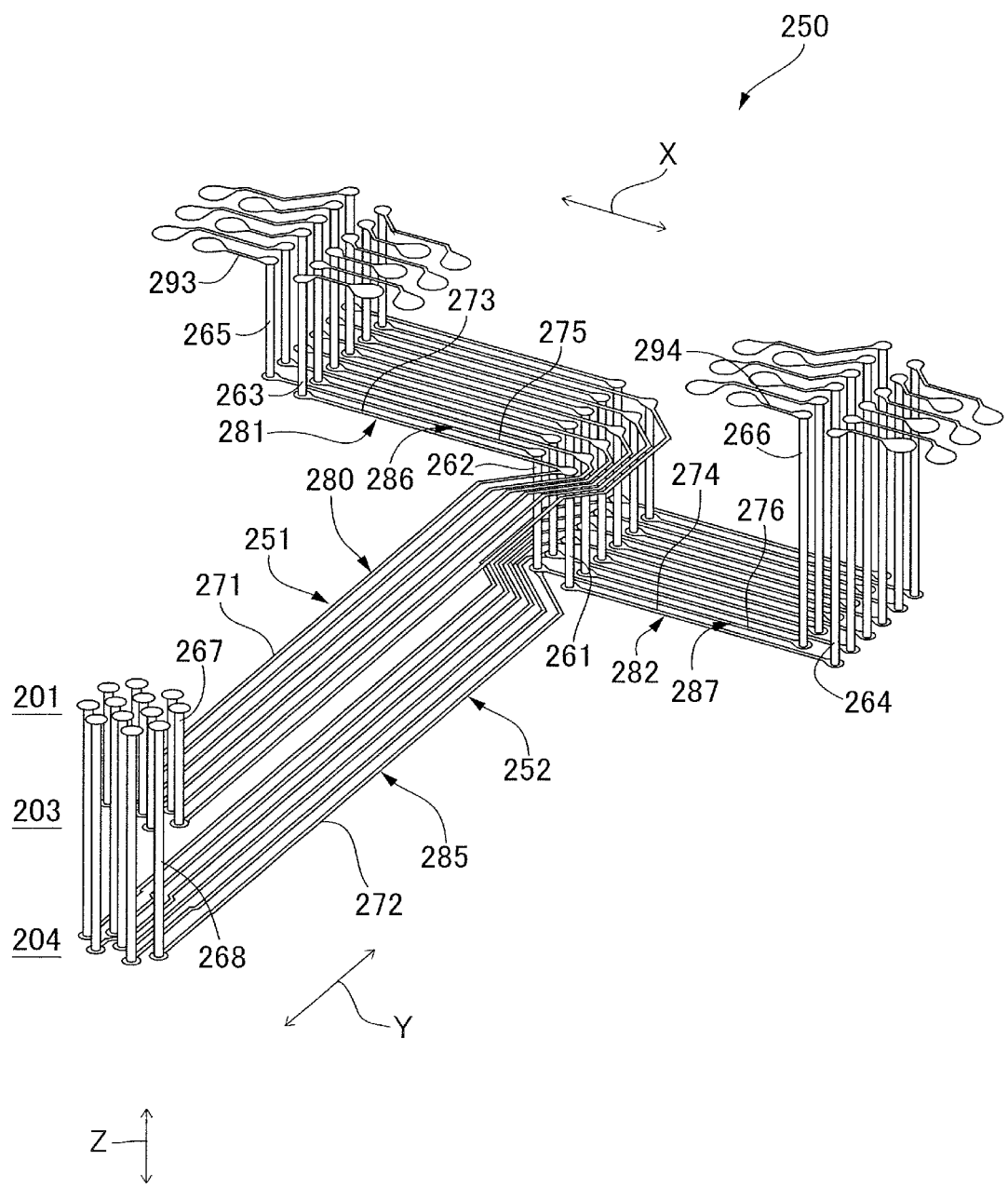
FIG. 8 is a perspective view of the address/command signal wirings of Example 1.

FIG. 7 is a plan view of the address/command signal wirings 250 of Example 1. FIG. 8 is a perspective view of the address/command signal wirings 250 of Example 1. In the first exemplary embodiment, the case where the address/command signal wirings 250 are constituted by the eight wirings 251 and 252 made up of the four wirings 251 and the four wirings 252 has been described. In Example 1, a case where the address/command signal wirings 250 are constituted by twelve wirings 251 and 252 made up of six wirings 251 and six wirings 252 will be described. To be noted, unillustrated terminal resistors having a resistance of 40Ω were disposed at branching points of the wirings 251 and 252.

In Example 1, the width of one main wiring in the X direction as viewed in the Z direction is 0.075 mm, and the interval between two adjacent main wirings in the X direction is 0.225 mm. As viewed in the Z direction, a width W1 occupied by the plurality of main wirings 280 and 285 in the X direction is 1.575 mm, and a length L1 of the plurality of main wirings 280 and 285 in the Y direction is 15.116 mm. In the case where the region occupied by the plurality of main wirings 280 and 285 is regarded as a rectangle, an area S1 thereof represented by W1×L1 is 23.808 mm².

As viewed in the Z direction, the width of one branching wiring is 0.075 mm, and the interval between two adjacent branching wirings in the Y direction is 0.200 mm. As viewed in the Z direction, a width W2 occupied by the branching wirings 281, 282, 286, and 287 in the Y direction is 3.100 mm, and a length L2 of the branching wirings 281, 282, 286, and 287 in the X direction is 15.920 mm. In the case where the region occupied by the branching wirings 281, 282, 286, and 287 is regarded as a rectangle, an area S2 thereof represented by W2×L2 is 49.352 mm². Therefore, an area S occupied by the address/command signal wirings 250 of Example 1 represented by S1+S2 is 73.160 mm².

Comparative Example 1

Figure 16:
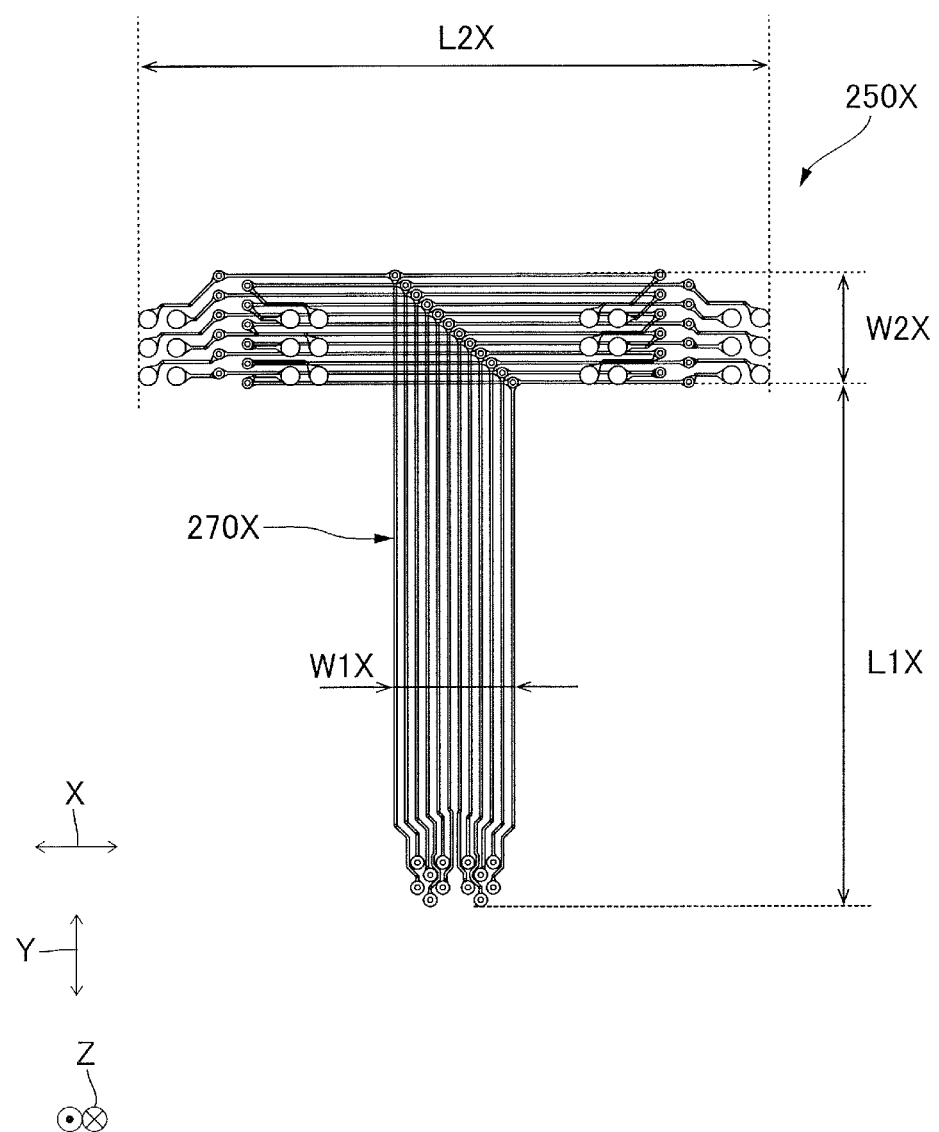
FIG. 16 is a plan view of address/command signal wirings of Comparative Example 1.
Figure 17:
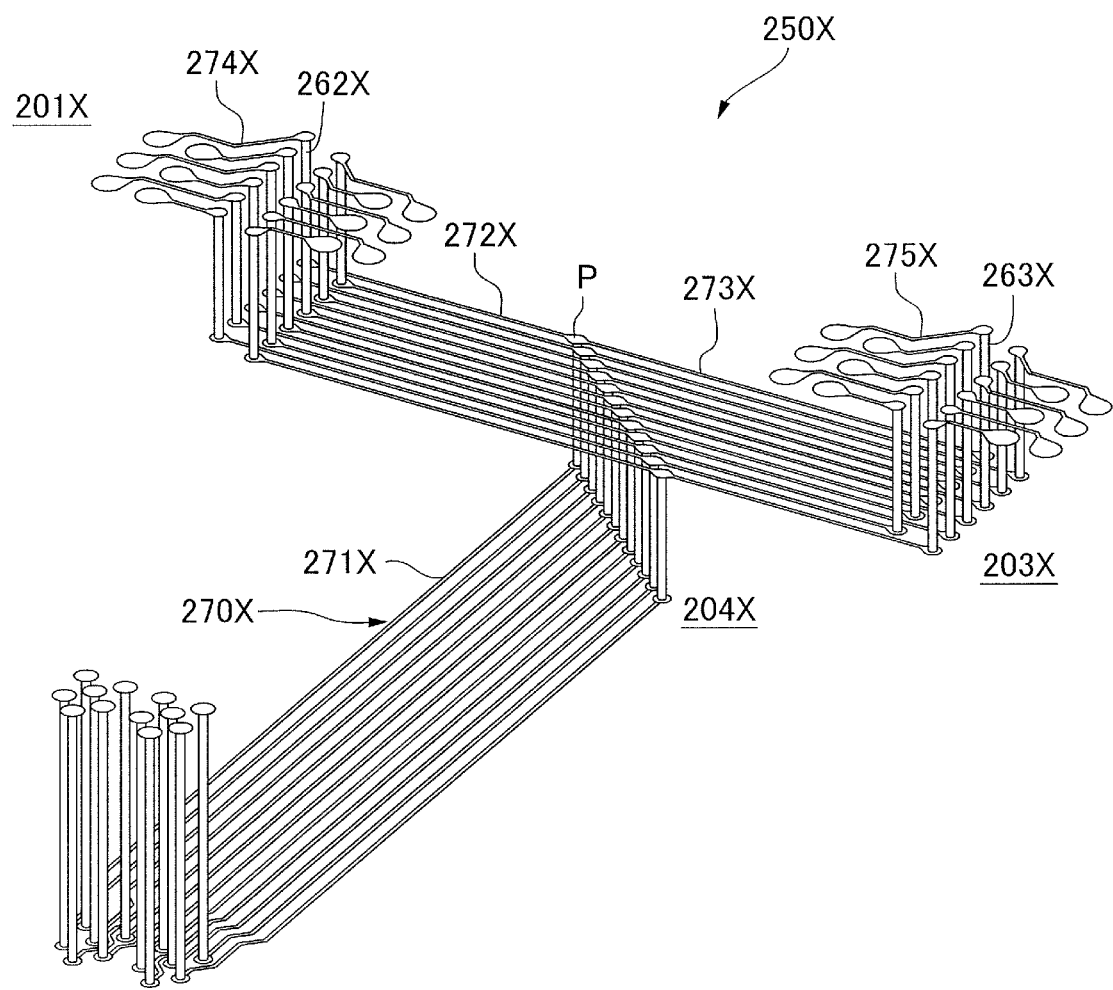
FIG. 17 is a perspective view of the address/command signal wirings of Comparative Example 1.

FIG. 16 is a plan view of address/command signal wirings 250X of Comparative Example 1. FIG. 17 is a perspective view of the address/command signal wirings 250X of Comparative Example 1. In the comparative example described above, the case where the address/command signal wirings 250X are constituted by the eight wirings 270X has been described. In Comparative Example 1, a case where the address/command signal wirings 250X are constituted by twelve wirings 270X will be described.

As viewed in the Z direction, the width of one main wiring in the X direction is 0.075 mm, and the interval between two adjacent main wirings in the X direction is 0.225 mm. As viewed in the Z direction, a width W1X occupied by the plurality of main wirings in the X direction is 3.375 mm, and a length L1X thereof in the Y direction is 14.762 mm. In the case where the region occupied by the plurality of main wirings is regarded as a rectangle, an area S1X thereof represented by W1X×L1X is 49.822 mm².

As viewed in the Z direction, the width of one branching wiring is 0.075 mm, and the interval between two adjacent branching wirings in the Y direction is 0.200 mm. As viewed in the Z direction, a width W2X occupied by the plurality of branching wirings in the Y direction is 3.100 mm, and a length L2X of thereof in the X direction is 17.710 mm. In the case where the region occupied by the plurality of branching wirings is regarded as a rectangle, an area S2X thereof represented by W2X×L2X is 54.901 mm². Therefore, an area SX occupied by the address/command signal wirings 250X of Comparative Example 1 represented by S1X+S2X is 104.723 mm².

First, Example 1 and Comparative Example 1 are compared in terms of the main wirings. Although the length L1 of Example 1 is slightly longer than the length L1X of Comparative Example 1 due to some conditions concerning wiring design, the width W1 of Example 1 can be set to a value equal to or smaller than a half of the width W1X of Comparative Example 1, and thus the area S1 of Example 1 can be set to a value equal to or smaller than a half of the area S1X of Comparative Example 1.

Example 1 and Comparative Example 1 are compared in terms of the branching wirings. The width W1 of the main wiring of Example 1 can be set to a value smaller than the width W1X of the main wiring of Comparative Example 1. Therefore, in Example 1, the two memory devices can be arranged with a smaller interval therebetween, and thus the length L2 of Example 1 can be set to a smaller value than the length L2X of Comparative Example 1. Therefore, the area S2 of Example 1 can be set to a value smaller than the area S2X of Comparative Example 1.

Whereas the area SX of Comparative Example 1 is 104.723 mm², the area S of Example 1 is 73.16 mm². That is, the area of the entirety of the address/command signal wirings 250 can be reduced by 31.563 mm², which corresponds to 30% of the total area. The effect of reducing the area is greater in the case where the overlapping portion of the region R4 of the main wirings 280 in the wiring layer 203 illustrated in FIG. 8 and the region R5 of the main wirings 285 in the wiring layer 204 illustrated in FIG. 8 as viewed in the Z direction in FIG. 7 is larger. By matching the regions R4 and R5 as viewed in the Z direction, the greatest effect of reducing the area can be obtained.

Example 2

As Example 2, simulation of signal waveforms was performed by using a simulator at the following conditions of dimensions in the configuration of the address/command signal wirings 250 of Example 1. As the simulator, Hyper Lynx available from Mentor Graphics was used. The transmission speed of address signals was set to 1200 Mbps. That is, pseudorandom signals of 600 MHz were used.

A layer configuration of the printed wiring board 200 in Example 2 will be described. The thickness of copper foil constituting each of the conductor patterns respectively disposed on the wiring layers 201 to 206 illustrated in FIG. 3 was set to 0.012 mm. The thickness of an insulating layer between the copper foil of the wiring layer 201 and the copper foil of the wiring layer 202 was set to 0.060 mm. The thickness of an insulating layer between the copper foil of the wiring layer 202 and the copper foil of the wiring layer 203 was set to 0.060 mm. The thickness of an insulating layer between the copper foil of the wiring layer 203 and the copper foil of the wiring layer 204 was set to 0.200 mm. The thickness of an insulating layer between the copper foil of the wiring layer 204 and the copper foil of the wiring layer 205 was set to 0.060 mm. The thickness of an insulating layer between the copper foil of the wiring layer 205 and the copper foil of the wiring layer 206 was set to 0.060 mm.

In Example 2, the length of the conductor patterns 275 of the branching wirings 286 and the length of the conductor patterns 276 of the branching wirings 287 illustrated in FIG. 8 were set to be equal. The length of the conductor patterns 272 of the main wirings 285 was set to 17.54 mm. The length of the conductor patterns 275 of the branching wirings 286 was set to 5.30 mm. The length of the conductor patterns 276 of the branching wirings 287 was set to 5.30 mm. The length of conductor patterns 293 that are not illustrated in the first exemplary embodiment, were disposed on the wiring layer 201 serving as a surface layer, were electrically connected to the via conductors 265, and were bonded to the receiving terminals 362 of the memory device 311 illustrated in FIG. 4A was set to 2.51 mm. The length of conductor patterns 294 that are not illustrated in the first exemplary embodiment, were disposed on the wiring layer 201 serving as a surface layer, were electrically connected to the via conductors 266, and were bonded to the receiving terminals 364 of the memory device 312 illustrated in FIG. 4A was set to 2.51 mm.

Figure 9A:
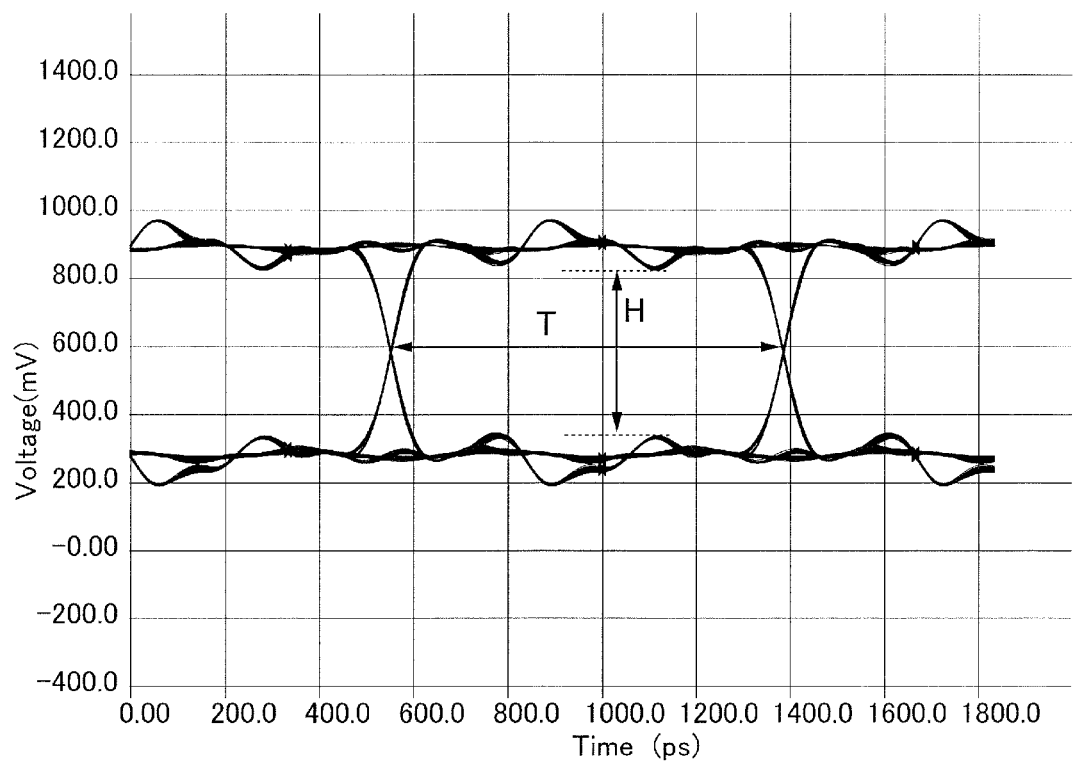
FIG. 9A is a simulation waveform diagram of signals of Example 2.
Figure 9B:
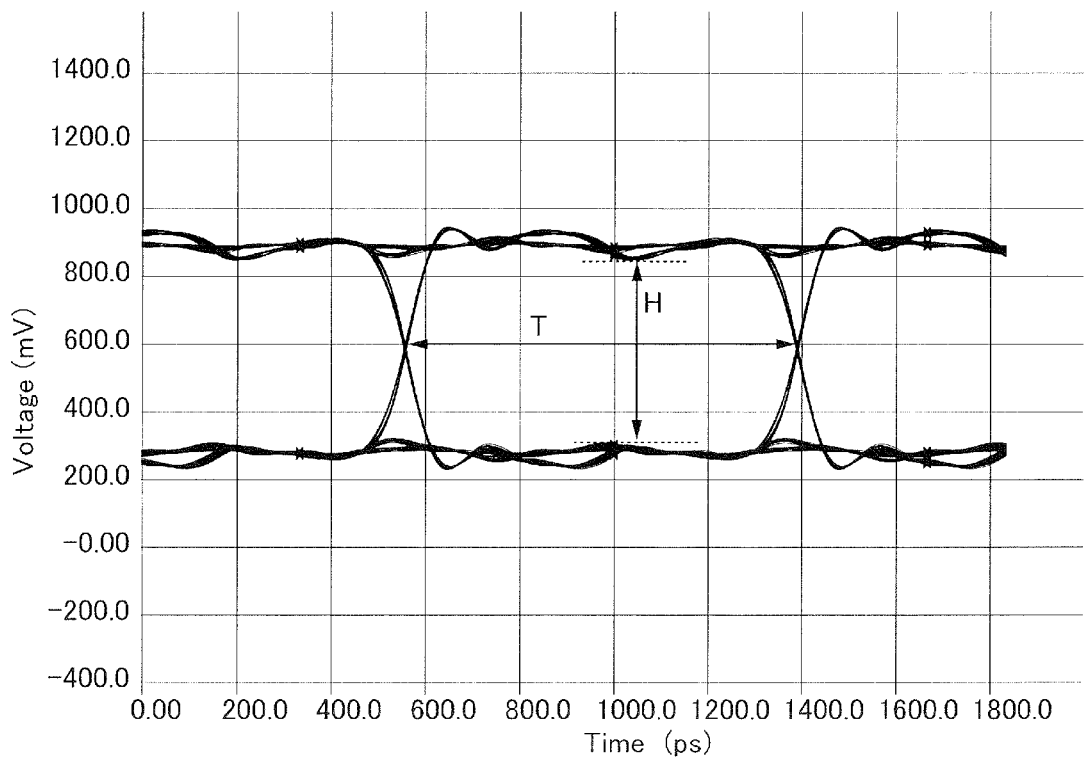
FIG. 9B is a simulation waveform diagram of signals of Example 2.

FIG. 9A is a simulation waveform diagram of signals received by the receiving terminals 362 of the memory device 311 in Example 2. FIG. 9B is a simulation waveform diagram of signals received by the receiving terminals 364 of the memory device 312 in Example 2. In FIGS. 9A and 9B, the opening of an eye pattern was measured. A height H of the eye pattern was 474 mV, and a width T of the eye pattern was 820 psec.

Comparative Example 2

As Comparative Example 2, simulation of signal waveforms was performed by using the same simulator as Example 1 at the following conditions of dimensions in the configuration of the address/command signal wirings 250X of Comparative Example 1. In addition, the layer configuration of the printed wiring board of Comparative Example 2 was set to be the same as the layer configuration of the printed wiring board of Example 2.

In wirings 270X illustrated in FIG. 17, the length of conductor patterns 272X in one group of branching wirings is different from the length of conductor pattern 273X in the other group of branching wirings in many cases. The length of conductor patterns 271X of main wirings was set to 17.54 mm. The length of the conductor patterns 272X in the one group of branching wirings was set to 4.59 mm. The length of the conductor patterns 273X in the other group of branching wirings was set to 7.45 mm. The length of conductor patterns 274X that were disposed on the wiring layer 201X serving as a surface layer, were electrically connected to the via conductors 262X, and were bonded to signal terminals of the memory device 311 was set to 2.51 mm. The length of conductor patterns 275X that were disposed on the wiring layer 201X serving as a surface layer, were electrically connected to the via conductors 266X, and were bonded to signal terminals of the memory device 312 was set to 2.51 mm. Unillustrated terminal resistors having a resistance of 40Ω were disposed at branching point P illustrated in FIG. 17.

Figure 18A:
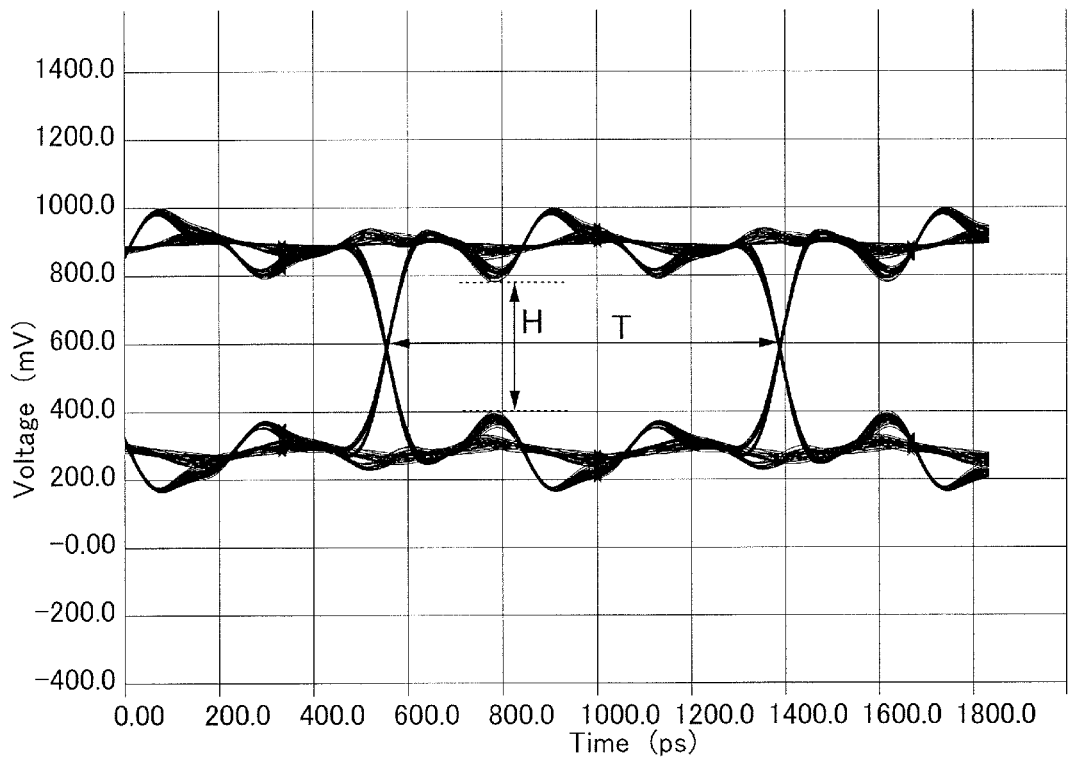
FIG. 18A is a simulation waveform diagram of signals of Comparative Example 2.
Figure 18B:
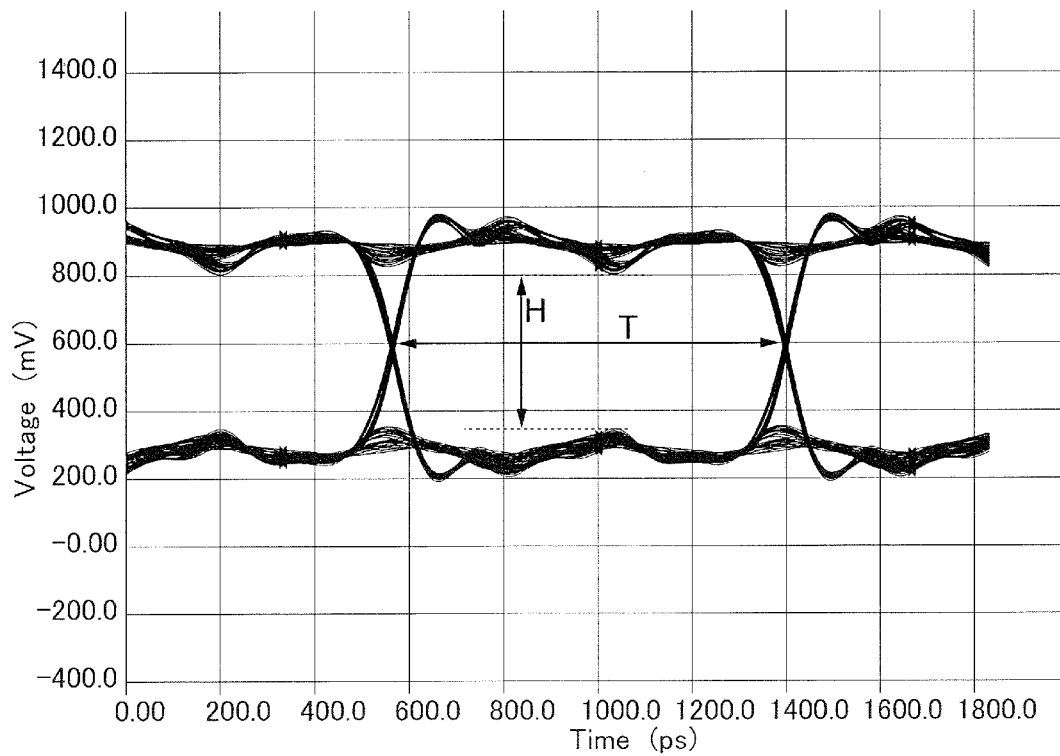
FIG. 18B is a simulation waveform diagram of signals of Comparative Example 2.

FIG. 18A is a simulation waveform diagram of signals received by the receiving terminals of the memory device 311 in Comparative Example 2. FIG. 18B is a simulation waveform diagram of signals received by the receiving terminals of the memory device 312 in Comparative Example 2. In FIGS. 18A and 18B, the opening of an eye pattern was measured. A height H of the eye pattern was 381 mV, and a width T of the eye pattern at a terminal voltage of 600 mV was 814 psec.

As can be seen from the results of the simulation described above, in the configuration of Example 2, the height of the eye pattern was improved by 93 mV and the width of the eye pattern was improved by 6 psec as compared with the configuration of Comparative Example 2. It was confirmed that, by using branching wirings of the same length, multiple reflection of signals can be suppressed, and thus noises can be reduced.

Second Exemplary Embodiment

A printed circuit board according to a second exemplary embodiment will be described. In the printed circuit board of the second exemplary embodiment, the configuration of part of the first wirings in the printed wiring board is different from the first exemplary embodiment. The printed wiring board will be described below.

Figure 10A:
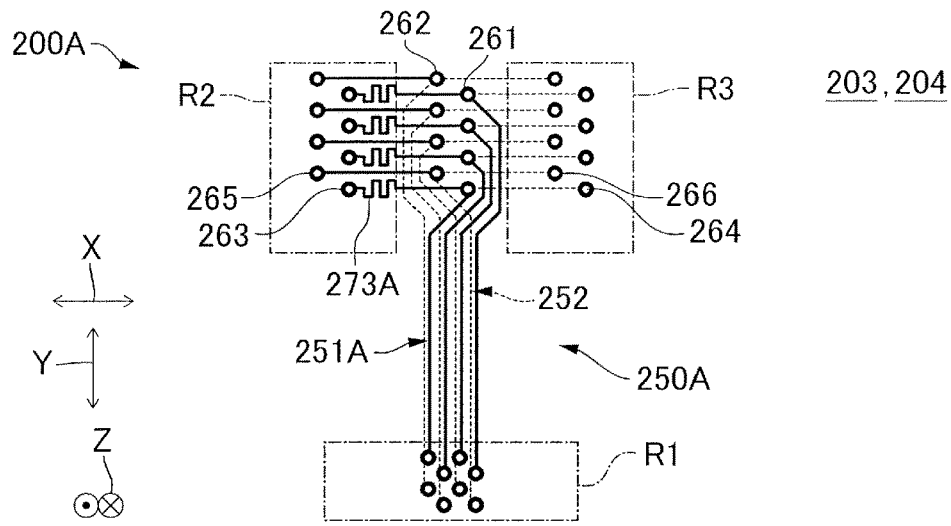
FIG. 10A is a schematic view of first wirings and second wirings according to a second exemplary embodiment.
Figure 10B:
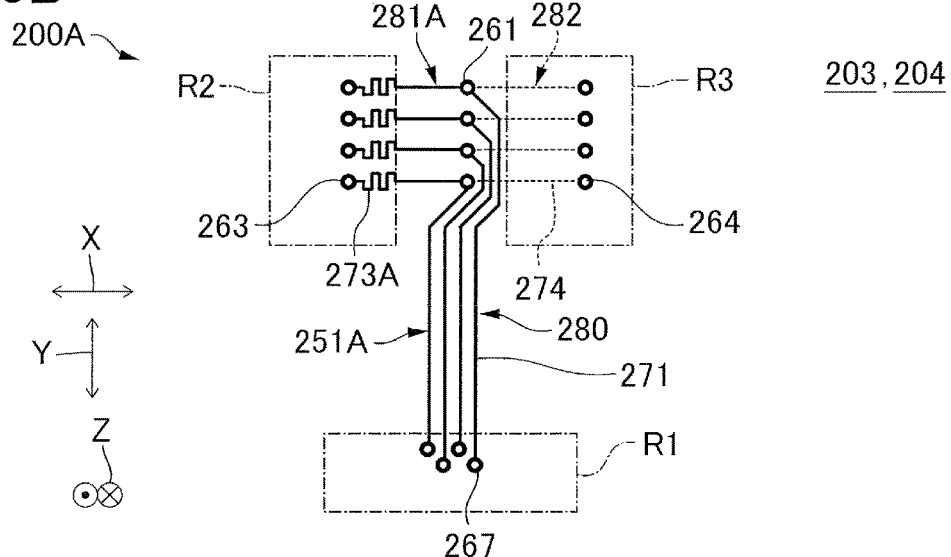
FIG. 10B is a schematic view of the first wirings according to the second exemplary embodiment.
Figure 10C:
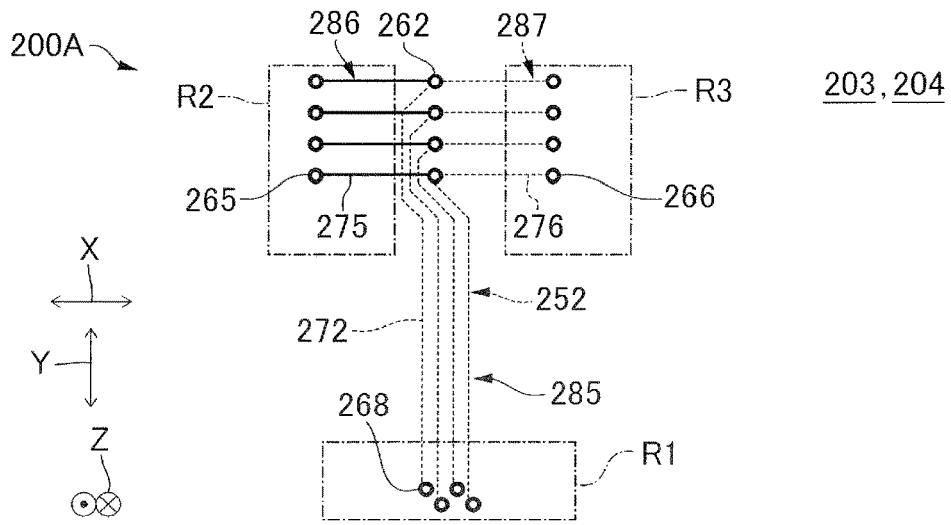
FIG. 10C is a schematic view of the second wirings according to the second exemplary embodiment.

FIG. 10A is a schematic view of first wirings and second wirings of the printed wiring board according to the second exemplary embodiment. FIG. 10B is a schematic view of the first wirings of the printed wiring board according to the second exemplary embodiment. FIG. 10C is a schematic view of the second wirings of the printed wiring board according to the second exemplary embodiment. A printed wiring board 200A according to the second exemplary embodiment includes wirings 251A serving as first wirings and wirings 252 having the same configuration as in the first exemplary embodiment and serving as second wirings.

The wirings 251A include the via conductors 267, the conductor patterns 271, the via conductors 261, the via conductors 263, the conductor patterns 274, and the via conductors 264 similarly to the first exemplary embodiment. The wirings 251A include conductor patterns 273A serving as third conductor patterns that are disposed on the wiring layer 203 serving as a first layer and that electrically connect the via conductors 261 to the via conductors 263. The configuration of these conductor patterns 273A is different from that of the conductor patterns 273 of the first exemplary embodiment. The other elements than these are the same as in the first exemplary embodiment.

Whereas the conductor patterns 273 of the first exemplary embodiment are linear conductor patterns, the conductor patterns 273A of the second exemplary embodiment are configured as conductor patterns having meander shapes, and the wiring length, that is, the electrical length thereof is longer than that of the conductor patterns 273.

Figure 11A:
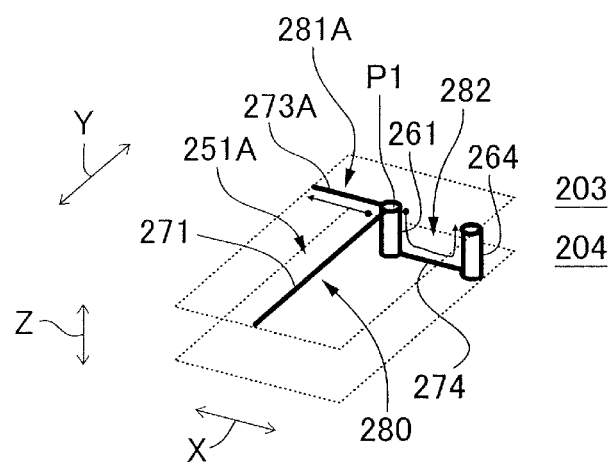
FIG. 11A is a schematic perspective view of a part of the first wiring according to the second exemplary embodiment.
Figure 11B:
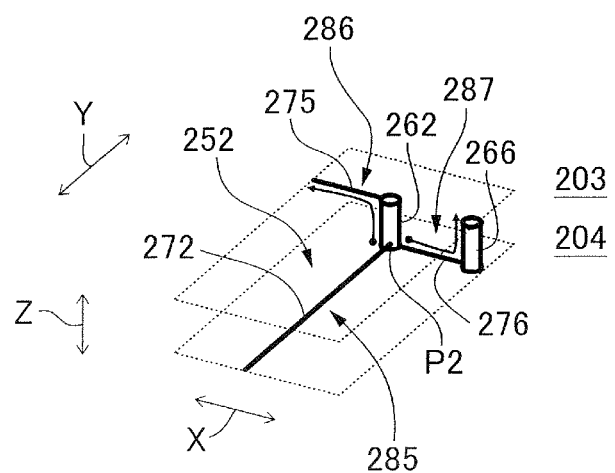
FIG. 11B is a schematic perspective view of a part of the second wiring according to the second exemplary embodiment.

FIG. 11A is a schematic perspective view of a part of the wiring 251A according to the second exemplary embodiment. FIG. 11B is a schematic perspective view of a part of the wiring 252 according to the second exemplary embodiment. FIGS. 11A and 11B respectively illustrate the wiring layer 203 serving as a first layer and the wiring layer 204 serving as a second layer.

As illustrated in FIG. 11A, branching points P1 at which the branching wirings 281A and 282 branch from the main wirings 280 are portions of the via conductors 261 in the wiring layer 203. Meanwhile, as illustrated in FIG. 11B, branching points P2 at which the branching wirings 286 and 287 branch from the main wirings 285 are portions of the via conductors 262 in the wiring layer 204. In the branching wirings 286 of the wirings 252, signals are transmitted to the memory device through the via conductors 262 from the wiring layer 204 to the wiring layer 203 and through the conductor patterns 275. In the branching wirings 287 of the wirings 252, signals are transmitted to the memory device through the conductor patterns 276 and through the via conductors 266 from the wiring layer 204 to the wiring layer 203. Therefore, by setting the wiring lengths of the conductor patterns 275 and the conductor patterns 276 to be equal, the electrical lengths of the branching wirings 286 and the branching wirings 287 can be set to be equal.

In the branching wirings 281A of the wirings 251A, signals are transmitted to the memory device through the conductor patterns 273A without passing through the via conductors 261. In the branching wirings 282 of the wirings 251A, signals are transmitted to the conductor patterns 274 through the via conductors 261 from the wiring layer 203 to the wiring layer 204, and are then further transmitted to the memory device through the via conductors 264 from the wiring layer 203 to the wiring layer 204. In the branching wirings 282, since signals go back and forth between the wiring layers 203 and 204, a delay time occurs. In the second exemplary embodiment, the conductor patterns 273A of the branching wirings 281A are formed in meander shapes, and thus adjustment is made such that a timing at which signals reach the memory device through the branching wirings 281A and a timing at which signals reach the memory device through the branching wirings 282 match.

That is, by forming the conductor patterns 273A in meander shapes, the electrical lengths of the branching wirings 281A and the branching wirings 282 can be made equal while reducing the area that the address/command signal wirings 250A occupy in the printed wiring board 200A. As a result of this, multiple reflection noises caused by unequal branching lengths are suppressed, the quality of signal waveforms is improved, and thus signal transmission of higher speed can be realized.

Example 3

Figure 12:
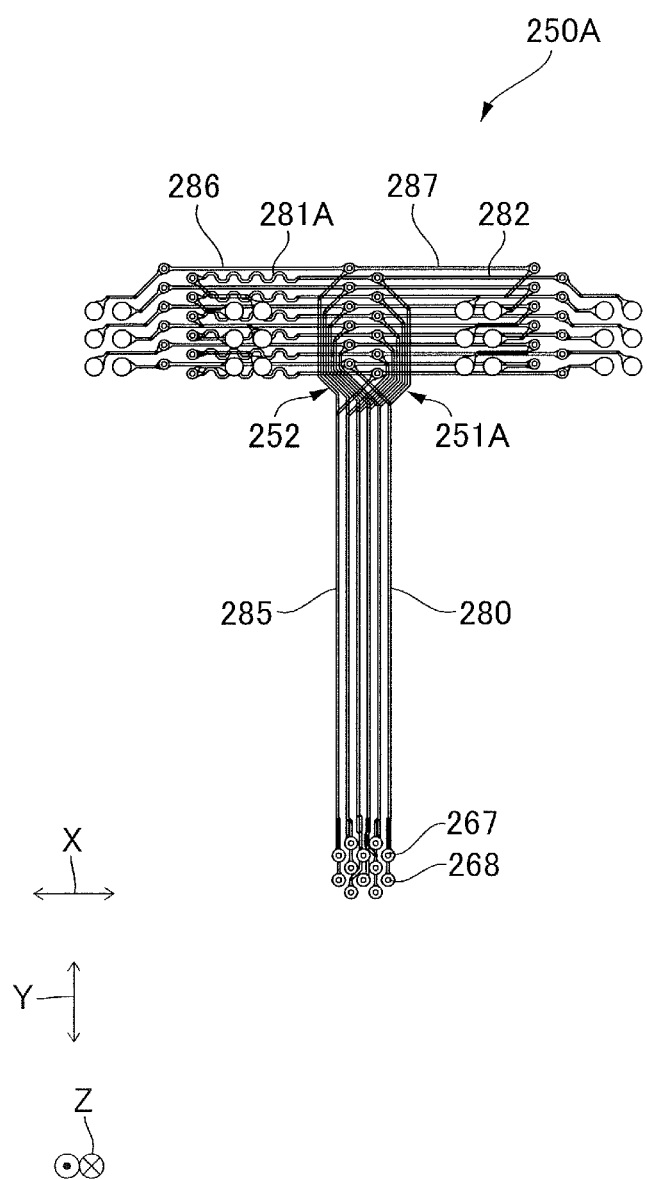
FIG. 12 is a plan view of address/command signal wirings of Example 3.
Figure 13:
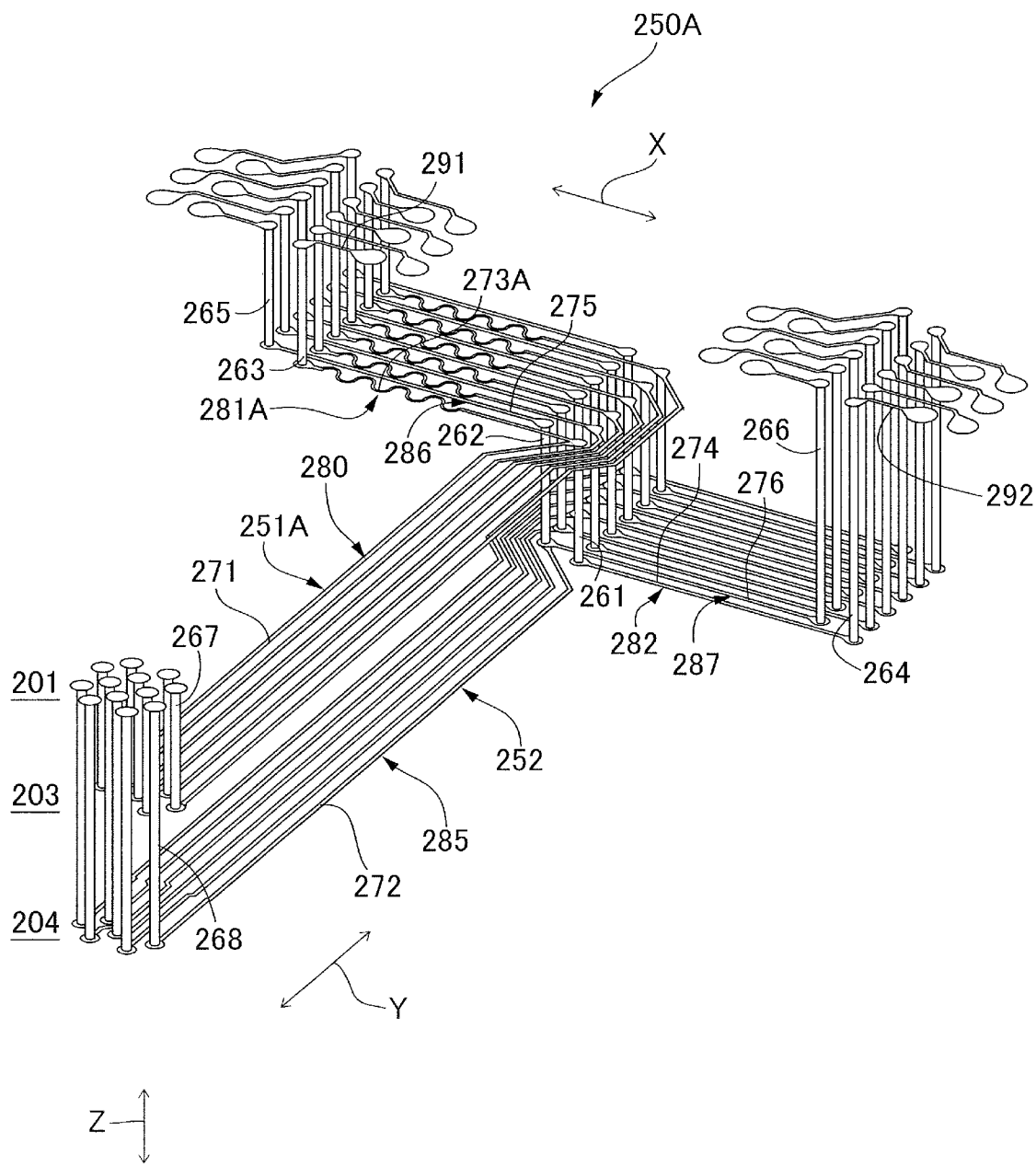
FIG. 13 is a perspective view of the address/command signal wirings of Example 3.

FIG. 12 is a plan view of address/command signal wirings 250A of Example 3. FIG. 13 is a perspective view of the address/command signal wirings 250A of Example 3. In the second exemplary embodiment, the case where the address/command signal wirings 250A are constituted by the eight wirings 251A and 252 made up of the four wirings 251A and the four wirings 252 has been described. In Example 3, a case where the address/command signal wirings 250A are constituted by twelve wirings 251A and 252 made up of six wirings 251A and six wirings 252 will be described.

The number and dimensions of layers of the printed wiring board of Example 3 were set to be the same as Example 2. Simulation of signal waveforms was performed by using a simulator in the configuration of the address/command signal wirings 250A illustrated in FIGS. 12 and 13. As the simulator, Hyper Lynx available from Mentor Graphics was used. The transmission speed of address signals was set to 1200 Mbps. That is, pseudorandom signals of 600 MHz were used.

The length of the conductor patterns 271 of the main wirings 280 was set to 17.26 mm. The length of the conductor patterns 273A of the branching wirings 281A was set to 6.45 mm, which was 44.6 psec in terms of propagation time of signals. The length of the conductor patterns 274 of the branching wirings 282 was set to 5.30 mm, which was 36.6 psec in terms of propagation time of signals. The length of conductor patterns 291 that are not illustrated in the second exemplary embodiment, were disposed on the wiring layer 201 serving as a surface layer, were electrically connected to the via conductors 263, and were bonded to the receiving terminals 361 of the memory device 311 illustrated in FIG. 4A was set to 2.51 mm. The length of conductor patterns 292 that are not illustrated in the second exemplary embodiment, were disposed on the wiring layer 201 serving as a surface layer, were electrically connected to the via conductors 264, and were bonded to the receiving terminals 363 of the memory device 312 illustrated in FIG. 4A was set to 2.51 mm.

The delay time of the via conductors 261 was measured, and the measured value was 4 psec. Therefore, the conductor patterns 273A was formed in meander shapes longer than the conductor patterns 274 by 1.15 mm, which corresponds to 8 psec that is a delay time of two via conductors 261.

Figure 14A:
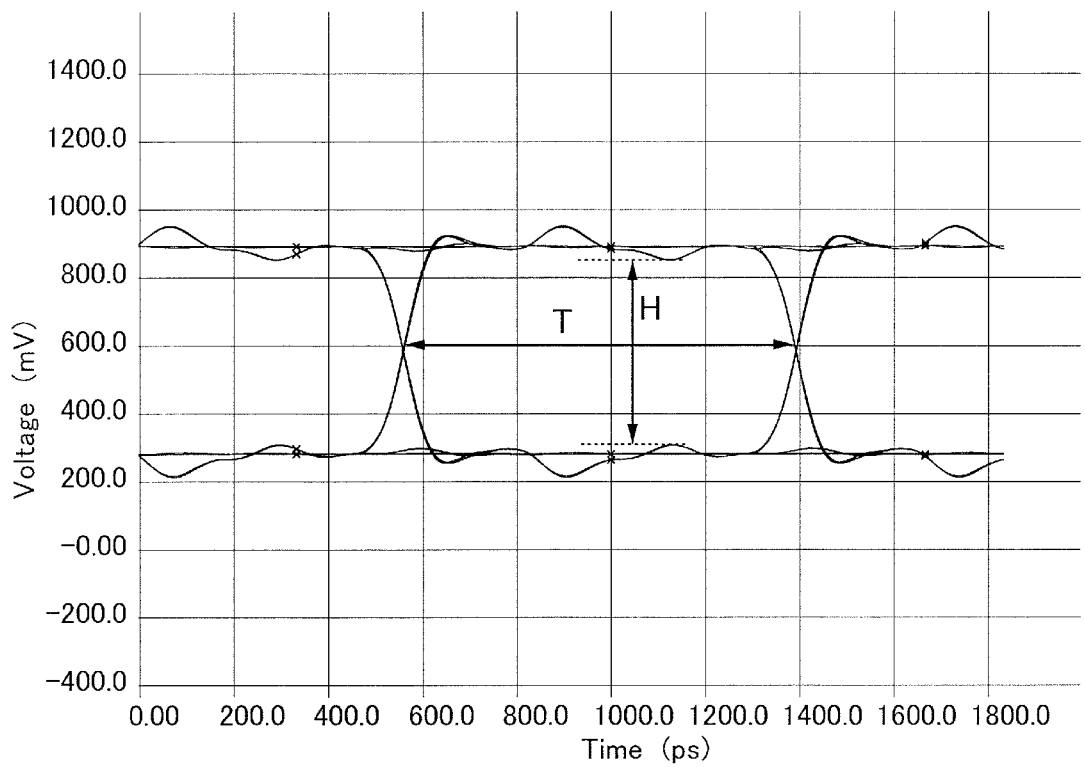
FIG. 14A is a simulation waveform diagram of signals of Example 3.
Figure 14B:
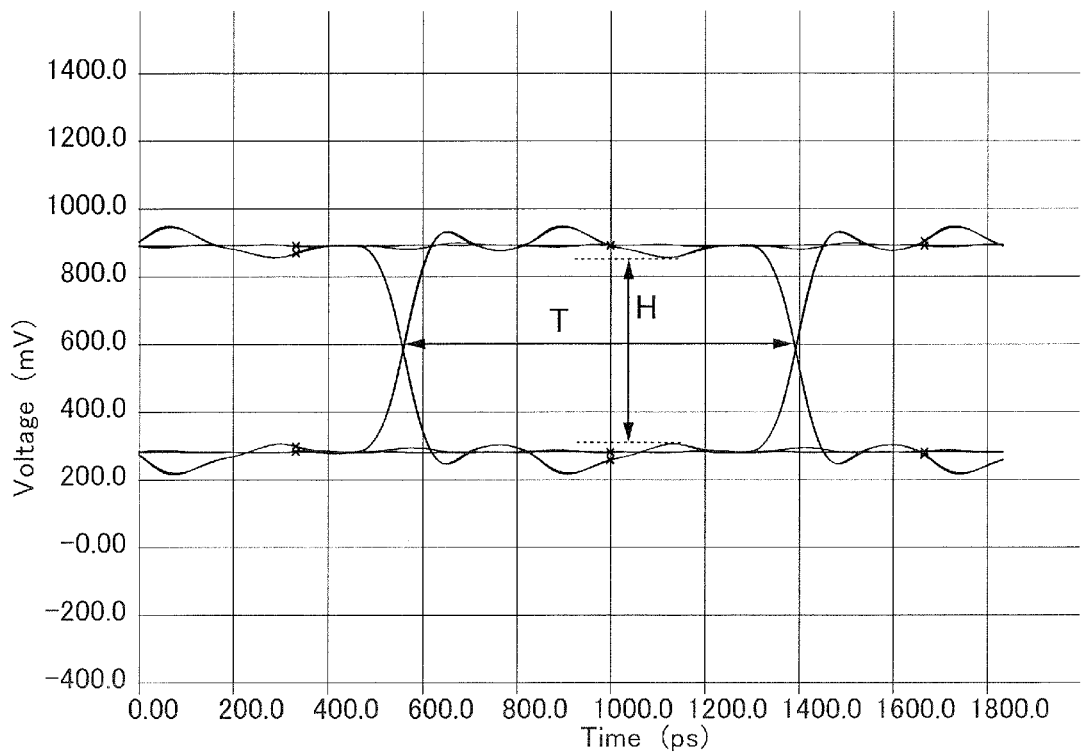
FIG. 14B is a simulation waveform diagram of signals of Example 3.

FIG. 14A is a simulation waveform diagram of signals received by the receiving terminals 361 of the memory device 311 in Example 3. FIG. 14B is a simulation waveform diagram of signals received by the receiving terminals 362 of the memory device 312 in Example 3. In FIGS. 14A and 14B, the opening of an eye pattern was measured. A height H of the eye pattern was 538 mV, and a width T of the eye pattern was 825 psec.

As can be seen from the results of the simulation described above, in the configuration of Example 3, the height of the eye pattern was improved by 157 mV and the width of the eye pattern was improved by 11 psec as compared with the configuration of Comparative Example 2. It was confirmed that, by using branching wirings of the same length, multiple reflection of signals can be suppressed, and thus noises can be reduced.

To be noted, the present invention is not limited to the exemplary embodiments described above, and can be modified in many ways within the technical concept of the present invention. In addition, the effects described in the exemplary embodiments are merely listing of most preferable effects that can be realized by the present invention, and the effects of the present invention are not limited to those described in the exemplary embodiments.

Although a case where the electronic device is a network camera has been described in the exemplary embodiments described above, the electronic device is not limited to this. For example, the present invention can be applied to various electronic devices that require a small outer shape and high-quality image data such as a portable digital camera and a smartphone.

Although a case where the printed wiring board includes a plurality of first wirings and a plurality of second wirings has been described in the exemplary embodiments described above, the configuration is not limited to this. That is, the printed wiring board may include only one first wiring and only one second wiring. For example, it suffices as long as the address/command signal wirings include at least one of each of the first wiring and the second wiring. In addition, bus wirings other than the address/command signal wirings may include the first wiring and the second wiring instead of the address/command signal wirings.

Although a case where it is preferable that the via conductors 261 are arranged on the straight wiring L1 serving as a first straight wiring and the via conductors 262 are arranged on the straight wiring L2 serving as a second straight wiring has been described in the exemplary embodiments described above, the configuration is not limited to this. For example, the via conductors 261 may be in staggered arrangement, and the via conductors 262 may be in staggered arrangement.

In the exemplary embodiments described above, elements such as a memory controller and memory devices are mounted on a printed wiring board, and thus a printed circuit board is constituted. However, these elements are not mounted on the printed wiring board before the printed circuit board is manufactured. A printed wiring board on which the elements are not mounted also has the wiring structure of the exemplary embodiments described above, and has the same effect as the exemplary embodiments described above.

Although a case where the first element is the memory controller and the second element and the third element are each a memory device has been described in the exemplary embodiments described above, the configuration is not limited to this. The first element, the second element, and the third element may be any elements as long as the first element transmits signals to the second element and the third element through the printed wiring board.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-021418, filed Feb. 8, 2018, and Japanese Patent Application No. 2019-003833, filed Jan. 11, 2019, which are hereby incorporated by reference herein in their entirety.

What is claimed is:
1. A printed circuit board comprising:
a printed wiring board comprising a first layer and a second layer disposed with an interval therebetween;
a first element comprising a plurality of first transmission terminals and a plurality of second transmission terminals and provided on the printed wiring board;
a second element comprising a plurality of first receiving terminals and a plurality of second receiving terminals and provided on the printed wiring board; and a third element comprising a plurality of third receiving terminals and a plurality of fourth receiving terminals and provided on the printed wiring board, wherein the printed wiring board comprises:

a plurality of first wirings configured to electrically connect the plurality of first transmission terminals to the plurality of first receiving terminals and to the plurality of third receiving terminals; and a plurality of second wirings configured to electrically connect the plurality of second transmission terminals to the plurality of second receiving terminals and to the plurality of fourth receiving terminals, wherein the plurality of first wirings each comprise:

a first via conductor disposed to bridge the first layer and the second layer and disposed outside a first region in which the first element is positioned, a second region in which the second element is positioned, and a third region in which the third element is positioned in a plan view from a direction perpendicular to a main surface of the printed wiring board; and a first conductor pattern disposed on the first layer and extending from the first via conductor to the first region in the plan view, wherein the plurality of second wirings each comprise:

a second via conductor disposed to bridge the first layer and the second layer and disposed outside the first region, the second region, and the third region in the plan view; and a second conductor pattern disposed on the second layer and extending from the second via conductor to the first region in the plan view, and wherein a fourth region is disposed so as to overlap with a fifth region in the plan view, the fourth region being a region in which a plurality of first conductor patterns each of which is the first conductor pattern are disposed, the fifth region being a region in which a plurality of second conductor patterns each of which is the second conductor pattern are disposed.

2. The printed circuit board according to claim 1, wherein at least one of the plurality of first conductor patterns is disposed so as to overlap with at least one of the plurality of second conductor patterns in the plan view.

3. The printed circuit board according to claim 1, wherein a plurality of first via conductors each of which is the first via conductor are arranged on a first straight wiring with intervals therebetween, and a plurality of second via conductors each of which is the second via conductor are arranged on a second straight wiring different from the first straight wiring with intervals therebetween.

4. The printed circuit board according to claim 1,
wherein the plurality of first wirings each comprise:
a third conductor pattern disposed on the first layer and extending from the first via conductor to the second region in the plan view; and
a fourth conductor pattern disposed on the second layer and extending from the first via conductor to the third region in the plan view, and
wherein the plurality of second wirings each comprise:
a fifth conductor pattern disposed on the first layer and extending from the second via conductor to the second region in the plan view; and
a sixth conductor pattern disposed on the second layer and extending from the second via conductor to the third region in the plan view.

5. The printed circuit board according to claim 4,
wherein the printed wiring board comprises a surface layer closer to the first layer than to the second layer, wherein the second element and the third element are both provided on the surface layer, wherein the plurality of first wirings each comprise:

a third via conductor disposed to bridge the surface layer and the first layer and disposed inside of the second region in the plan view to be connected to the third conductor pattern; and a fourth via conductor disposed to bridge the surface layer and the second layer and disposed inside of the third region in the plan view to be connected to the fourth conductor pattern, and wherein the plurality of second wirings each comprise:

a fifth via conductor disposed to bridge the surface layer and the first layer and disposed inside of the second region in the plan view to be connected to the fifth conductor pattern; and a sixth via conductor disposed to bridge the surface layer and the second layer and disposed inside of the third region in the plan view to be connected to the sixth conductor pattern.

6. The printed circuit board according to claim 4, wherein the fifth conductor pattern and the sixth conductor pattern are formed to have the same wiring length.

7. The printed circuit board according to claim 4, wherein the third conductor pattern is formed to have a meander shape.

8. The printed circuit board according to claim 1,
wherein the first element is a memory controller, and
wherein the second element and the third element are each a memory device.

9. The printed circuit board according to claim 8, wherein the first element transmits an address signal and a command signal to the second element and the third element respectively through the plurality of first wirings and the plurality of second wirings.

10. A printed wiring board on which a first region in which a first element comprising a plurality of first transmission terminals and a plurality of second transmission terminals is to be disposed, a second region in which a second element comprising a plurality of first receiving terminals and a plurality of second receiving terminals is to be disposed, and a third region in which a third element comprising a plurality of third receiving terminals and a plurality of fourth receiving terminals is to be disposed are present in a plan view from a direction perpendicular to a main surface, the printed wiring board comprising:

a first layer and a second layer disposed with an interval therebetween;

a plurality of first wirings configured to electrically connect the plurality of first transmission terminals to the plurality of first receiving terminals and to the plurality of third receiving terminals; and a plurality of second wirings configured to electrically connect the plurality of second transmission terminals to the plurality of second receiving terminals and to the plurality of fourth receiving terminals, wherein the plurality of first wirings each comprise:

a first via conductor disposed to bridge the first layer and the second layer and disposed outside the first region, the second region, and the third region in the plan view; and a first conductor pattern disposed on the first layer and extending from the first via conductor to the first region in the plan view, wherein the plurality of second wirings each comprise:

a second via conductor disposed to bridge the first layer and the second layer and disposed outside the first region, the second region, and the third region in the plan view; and a second conductor pattern disposed on the second layer and extending from the second via conductor to the first region in the plan view, and wherein a fourth region is disposed so as to overlap with a fifth region in the plan view, the fourth region being a region in which a plurality of first conductor patterns each of which is the first conductor pattern are disposed, the fifth region being a region in which a plurality of second conductor patterns each of which is the second conductor pattern are disposed.

11. An electronic device comprising:

a casing; and the printed circuit board according to claim 1 disposed in the casing.

12. A camera comprising:

a casing;

the printed circuit board according to claim 1 disposed in the casing; and an image pickup element disposed in the casing and electrically connected to the printed circuit board.

\* \* \* \* \*